US009772096B2

(12) United States Patent
Aruga et al.

(10) Patent No.: US 9,772,096 B2
(45) Date of Patent: Sep. 26, 2017

(54) ILLUMINATION DEVICE

(71) Applicants: MITSUBISHI HEAVY INDUSTRIES, LTD., Tokyo (JP); LUMIOTEC INC., Yonezawa-shi, Yamagata (JP)

(72) Inventors: Hiroyasu Aruga, Tokyo (JP); Tadashi Katsume, Tokyo (JP)

(73) Assignees: MITSUBISHI HEAVY INDUSTRIES, LTD., Tokyo (JP); LUMIOTEC INC., Yamagata (JP)

( * ) Notice: Subject to any disclaimer, the term of this patent is extended or adjusted under 35 U.S.C. 154(b) by 70 days.

(21) Appl. No.: 14/418,375

(22) PCT Filed: Sep. 4, 2013

(86) PCT No.: PCT/JP2013/073779
§ 371 (c)(1),
(2) Date: Jan. 29, 2015

(87) PCT Pub. No.: WO2014/038583
PCT Pub. Date: Mar. 13, 2014

(65) Prior Publication Data
US 2015/0151679 A1 Jun. 4, 2015

(30) Foreign Application Priority Data

Sep. 5, 2012 (JP) ................................ 2012-195469

(51) Int. Cl.
F21V 23/06 (2006.01)
B64D 11/00 (2006.01)
(Continued)

(52) U.S. Cl.
CPC ................ *F21V 23/06* (2013.01); *B60Q 3/43* (2017.02); *B60Q 3/47* (2017.02); *B60Q 3/745* (2017.02);
(Continued)

(58) Field of Classification Search
CPC ............ B60Q 3/06; F21V 29/70; H01L 27/32
See application file for complete search history.

(56) References Cited

U.S. PATENT DOCUMENTS 7,332,857 B2    2/2008  Seo et al.
8,476,624 B1 *  7/2013  Wu ..................... H01L 51/5004
                                                257/40
(Continued)

FOREIGN PATENT DOCUMENTS

CN    101389533 A    3/2009
CN    101410296 A    4/2009
(Continued)

OTHER PUBLICATIONS

Office Action in CN Application No. 201380038450.3 dated Mar. 24, 2016.
(Continued)

*Primary Examiner* — Anne Hines
(74) *Attorney, Agent, or Firm* — Kanesaka Berner and Partners LLP

(57) ABSTRACT

This illumination device includes an organic EL illumination panel installed in a baggage rack or the like in a fuselage of an aircraft, and a panel driving circuit that drives the organic EL illumination panel and is installed in a different place apart from the organic EL illumination panel in the fuselage to drive the organic EL illumination panel. The organic EL illumination panel includes a plurality of light emitting units including at least a light emitting layer, and a charge generation layer arranged between the plurality of light emitting units to thereby form a multi-photoemission structure, and has a thickness of 5 mm or less in a stacking direction.

15 Claims, 22 Drawing Sheets

(51) Int. Cl.
    *B64D 47/02*    (2006.01)
    *F21V 29/70*    (2015.01)
    *F21V 11/16*    (2006.01)
    *F21V 23/04*    (2006.01)
    *B60Q 3/43*     (2017.01)
    *B60Q 3/47*     (2017.01)
    *B60Q 3/74*     (2017.01)
    *H01L 51/50*    (2006.01)

(52) U.S. Cl.
    CPC ............ *B64D 11/00* (2013.01); *B64D 11/003* (2013.01); *B64D 47/02* (2013.01); *F21V 11/16* (2013.01); *F21V 23/04* (2013.01); *F21V 29/70* (2015.01); *B64D 2011/0038* (2013.01); *H01L 51/5044* (2013.01); *Y02T 50/46* (2013.01)

(56) References Cited

U.S. PATENT DOCUMENTS

| | | |
|---|---|---|
| 2002/0125819 A1 | 9/2002 | Mishima |
| 2006/0163429 A1 | 7/2006 | Lierow |
| 2007/0236228 A1 | 10/2007 | Bock |
| 2008/0136230 A1 | 6/2008 | Ling |
| 2008/0266886 A1 | 10/2008 | Wentland et al. |
| 2010/0014009 A1 | 1/2010 | Stavaeus et al. |
| 2010/0033980 A1 | 2/2010 | Vogel et al. |
| 2010/0065683 A1 | 3/2010 | Darbyshire |
| 2011/0049756 A1 | 3/2011 | Sutter |
| 2011/0163697 A1 | 7/2011 | Mizukami et al. |
| 2011/0210203 A1 | 9/2011 | Chua et al. |
| 2012/0012707 A1 | 1/2012 | Schliwa et al. |
| 2012/0306373 A1 | 12/2012 | Kamada |

FOREIGN PATENT DOCUMENTS

| | | |
|---|---|---|
| CN | 101808899 A | 8/2010 |
| CN | 102027527 A | 4/2011 |
| CN | 102224073 A | 10/2011 |
| DE | 102007050481 A1 | 4/2009 |
| DE | 102009044454 A1 | 6/2010 |
| EP | 1351558 A1 | 10/2003 |
| EP | 2343215 A1 | 7/2011 |
| EP | 2650940 A1 | 10/2013 |
| JP | 63-223000 A | 9/1988 |
| JP | 2005-324694 A | 11/2005 |
| JP | 2006-518685 A | 8/2006 |
| JP | 2007-43080 A | 2/2007 |
| JP | 3933591 B2 | 6/2007 |
| JP | 2007-302162 A | 11/2007 |
| JP | 2008-080843 A | 4/2008 |
| JP | 2008-516837 A | 5/2008 |
| JP | 1331594 S | 6/2008 |
| JP | 2009-117195 A | 5/2009 |
| JP | 2009-526691 A | 7/2009 |
| JP | 4293314 B2 | 7/2009 |
| JP | 2009-531221 A | 9/2009 |
| JP | 2009-538251 A | 11/2009 |
| JP | 2010-192719 A | 9/2010 |
| JP | 2010-245036 A | 10/2010 |
| JP | 1399263 S | 10/2010 |
| JP | 2011-29108 A | 2/2011 |
| JP | 2011-513527 A | 4/2011 |
| JP | 2011-140264 A | 7/2011 |
| JP | 2011-165489 A | 8/2011 |
| JP | 2011-249021 A | 12/2011 |
| JP | 2012-500744 A | 1/2012 |
| RU | 2417924 C2 | 5/2011 |
| WO | 03/084810 A1 | 10/2003 |
| WO | 2010/062643 A1 | 6/2010 |
| WO | 2011/099542 A1 | 8/2011 |
| WO | 2012/075639 A1 | 6/2012 |

OTHER PUBLICATIONS

Office Action in RU Application No. 2015102987/11(004645) dated Jun. 23, 2016.
Written Opinion mailed Oct. 29, 2013, corresponding to International patent application No. PCT/JP2013/073779.
Partial Supplementary European Search Report dated Jun. 29, 2015, corresponding to European patent application No. 13835383.4.
International Search Report mailed Oct. 29, 2013 in corresponding International Application No. PCT/JP2013/073779 filed Sep. 4, 2013.
Extended European Search Report in EP Application No. 13835383.4 dated Nov. 26, 2015.
Office Action in RU Application No. 2015102987, mailed Nov. 2, 2016.
Office Action in JP Application No. 2012-195469, mailed Feb. 28, 2017.
Office Action in EP Application No. 13835383.4, mailed Oct. 26, 2016.

* cited by examiner

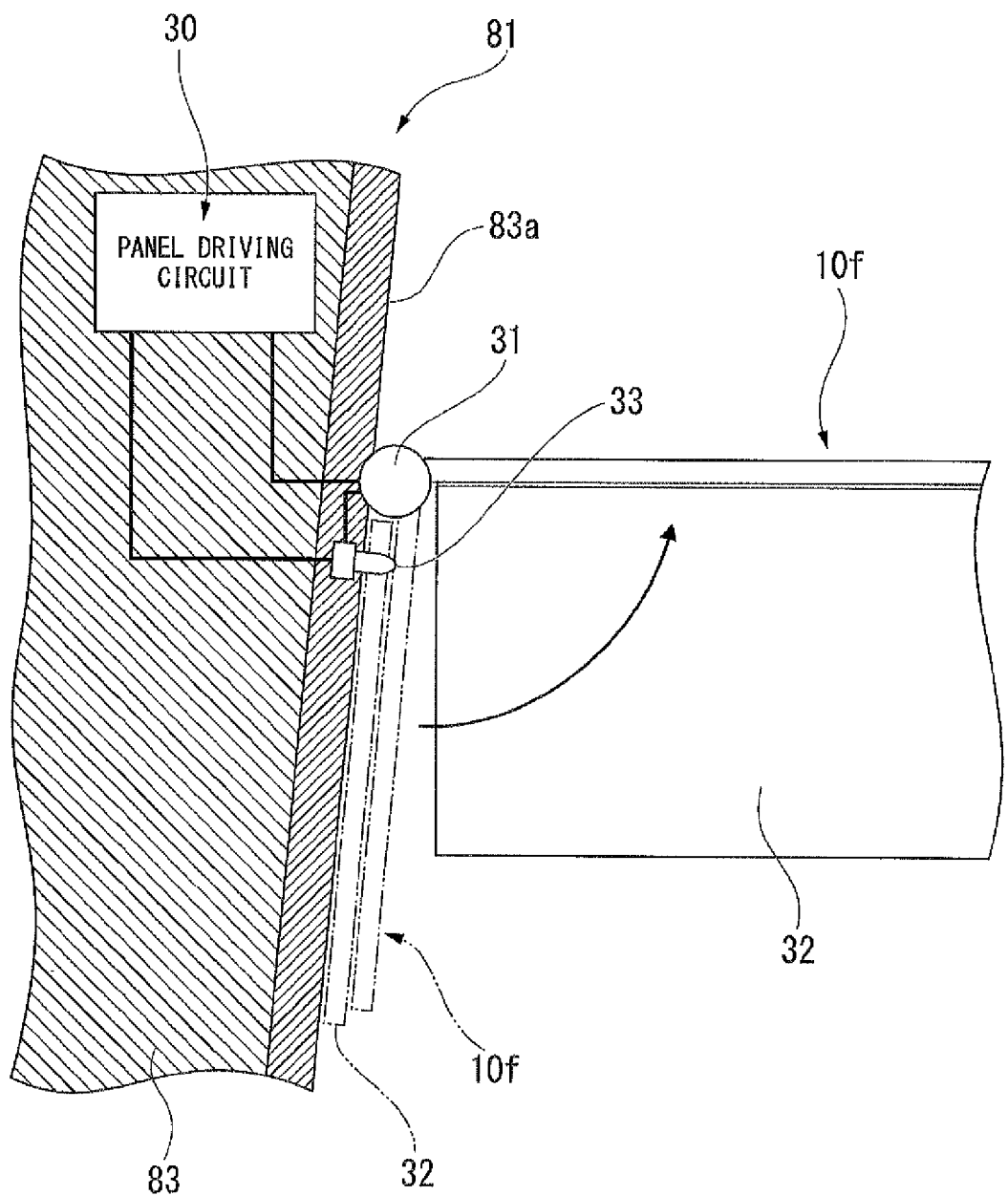

$$E_h = E_{h1} - E_{h2} - E_{h3} + E_{h4} \quad (4)$$

$$E_h = E_{h1} - E_{h2} + E_{h3} - E_{h4} \quad (5)$$

| POSITION | CALCULATION VALUE | ILLUMINANCE CRITERION (%) | |
|---|---|---|---|
| | | MINIMUM | MAXIMUM |
| a | 268 | 269 | 591 |
| b | 243 | 215 | 484 |
| c | 183 | 108 | 323 |
| d | 146 | 54 | 215 |
| e | 120 | – | 32 |
| f | 79 | – | 16 |

* FROM ARP 378

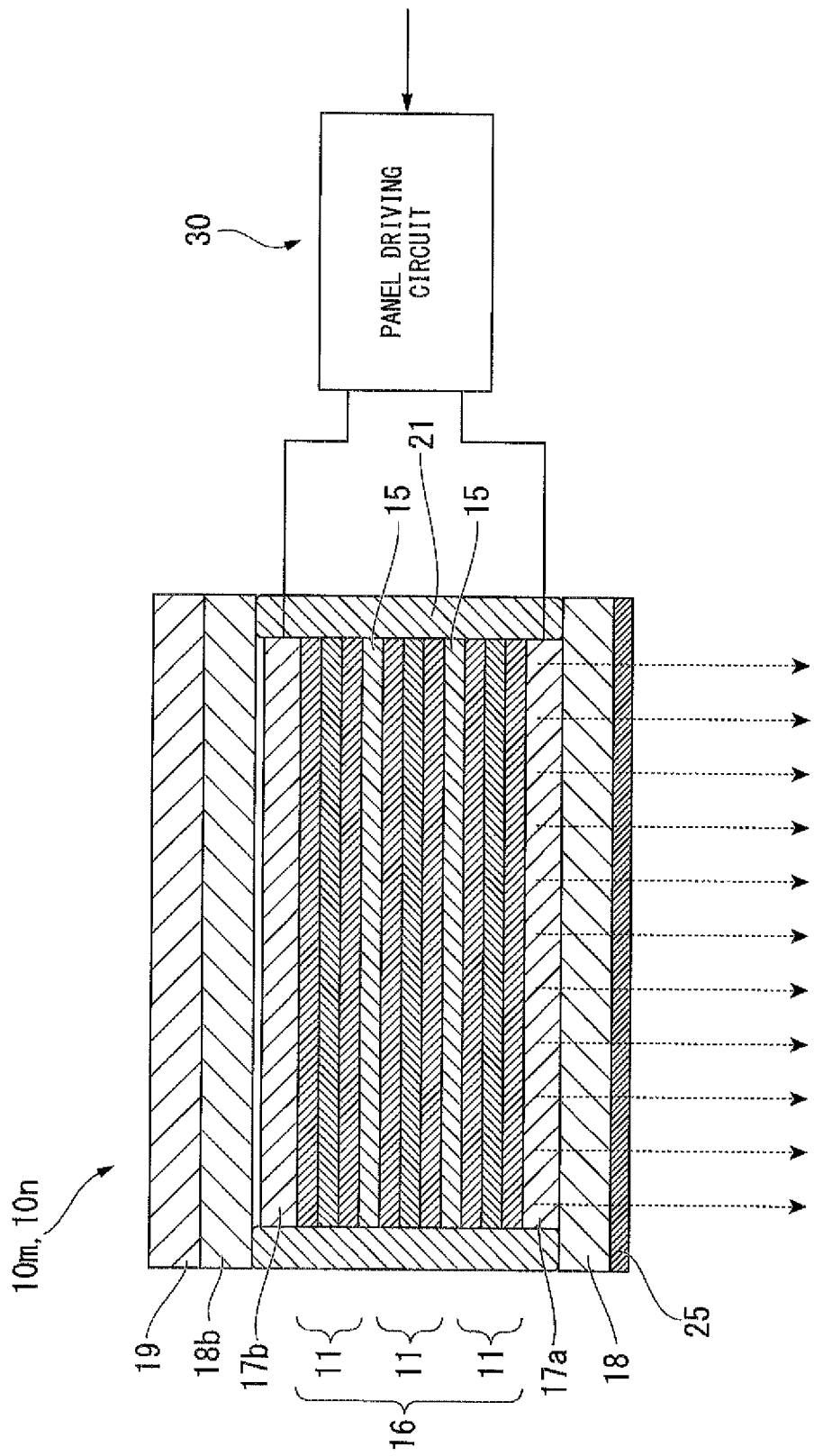

ILLUMINATION DEVICE

RELATED APPLICATIONS

The present application is a National Phase of International Application Number PCT/JP2013/073779, filed Sep. 4, 2013, which claims priority to Japanese Application Number 2012-195469, filed Sep. 5, 2012.

TECHNICAL FIELD

The present invention relates to an illumination device arranged in a fuselage of an aircraft.

Priority is claimed on Japanese Patent Application No. 2012-195469, filed Sep. 5, 2012, the content of which is incorporated herein by reference.

BACKGROUND ART

It is necessary for members or devices arranged in an aircraft to be small and lightweight. Therefore, it is necessary for an onboard illumination device of an aircraft to be similarly small and lightweight.

Therefore, Patent Literature 1 discloses that an organic EL (electro-luminescence) illumination device is used as an illumination device in a fuselage. Specifically, Patent Literature 1 discloses an example in which the organic EL illumination device is installed in an upper portion of a cabin window panel or the like.

CITATION LIST

Patent Literature

[Patent Literature 1]
Japanese Unexamined Patent Application, First Publication No. 2011-140264

SUMMARY OF INVENTION

Technical Problem

The organic EL illumination device is certainly smaller and more lightweight than other illumination devices. However, in the onboard illumination device for the aircraft, it is necessary for occupancy in a narrow internal space of the fuselage to be further decreased.

The present invention has been made in light of such a request, and an object of the present invention is to provide an illumination device capable of illuminating an internal space of a fuselage without substantially reducing the internal space of the fuselage.

Solution to Problem

According to one aspect of the present invention, an illumination device arranged in a fuselage of an aircraft includes an organic EL illumination panel installed in an aircraft member in the fuselage; and a panel driving circuit that drives the organic EL illumination panel and is installed in a different place apart from the organic EL illumination panel in the fuselage to drive the organic EL illumination panel.

The organic EL illumination panel includes a plurality of light emitting units including at least a light emitting layer including an organic material; a charge generation layer arranged between the plurality of light emitting units; a pair of electrodes that supply power from the panel driving circuit to a stacked body including the plurality of light emitting units and the charge generation layer; a transparent substrate arranged on the side opposite to the other electrode of the pair of electrodes with respect to one electrode of the pair of electrodes.

The organic EL illumination panel has a thickness of 5 mm or less in a stacking direction.

In the illumination device, the organic EL illumination panel having a thickness of 5 mm or less is installed in the aircraft member. The panel driving circuit that drives the organic EL illumination panel is installed in the other place apart from the organic EL illumination panel. Therefore, in the illumination device, a thickness of the member installed in the aircraft member is very small, and thus it is possible to illuminate a space to be illuminated by the illumination device without substantially reducing the space.

Further, since the organic EL illumination panel of the illumination device forms a multi-photoemission structure in which the plurality of light emitting units including at least a light emitting layer and the charge generation layer arranged between the plurality of light emitting units, it is possible to increase reliability of the illumination device and achieve a long lifespan and low power consumption.

Here, in the illumination device, a seat and a baggage rack arranged above the seat may be arranged in the fuselage, the aircraft member may be the baggage rack, and the organic EL illumination panel may be installed on a floor side of the baggage rack so that the transparent substrate is directed to the floor side, and have a luminance of 1000 cd/m$^2$ or more.

In the illumination device, it is possible to illuminate a space between the seat and the baggage rack over the seat at a desired illuminance without substantially reducing the space.

Further, in the illumination device, a ceiling member defining an upper portion of a space that a passenger enters may be arranged in the fuselage, the aircraft member may be the ceiling member, and the organic EL illumination panel may be installed on the floor side of the ceiling member so that the transparent substrate is directed to the floor, and have a luminance of 2000 cd/m$^2$ or more.

In this case, the organic EL illumination panel may be installed in a portion on the floor side of the ceiling member, which is a portion directly above an aisle of a floor.

In the illumination device, it is possible to illuminate space between the floor surface and the ceiling surface at a desired illuminance without substantially reducing the space.

Further, in the illumination device, a baggage rack may be arranged in the fuselage, and include a rack body having an opening formed therein, and a cover that closes the opening of the rack body, the aircraft member may be the cover, and the organic EL illumination panel may be installed inside of the rack body in the cover so that the transparent substrate is directed to the internal side, and have a luminance of 300 cd/m$^2$ or more.

In the illumination device, it is possible to illuminate the inside of the baggage rack at a desired illuminance without substantially reducing the inside of the baggage rack.

Further, in the illumination device, a floor member defining a lower portion of a space which a passenger enters may be arranged in the fuselage, the aircraft member may be the floor member, and the organic EL illumination panel may be installed on a ceiling side of the floor member so that the transparent substrate is directed to the ceiling side, and have a luminance of 15 cd/m$^2$ or more.

In the illumination device, it is possible to enable passengers to recognize the floor surface without obstructing passage of the passengers and substantially reducing the space on the floor surface.

In this case, the organic EL illumination panel may be installed on the ceiling side of the floor member and in a position along an aisle on the floor member.

In the illumination device, it is possible to enable a passenger to recognize an aisle.

Further, in the illumination device, a seat having a seat portion provided at an interval from a floor surface may be arranged in the fuselage, the aircraft member may be the seat portion or a support member that supports the seat portion from a floor side, and the organic EL illumination panel may be installed on the floor side of the seat or the support member so that the transparent substrate is directed to the floor and have a luminance of 150 $cd/m^2$ or more.

In the illumination device, it is possible to illuminate a downward space (footwell space) of the seat at a desired illuminance without substantially reducing the downward space.

Further, in the illumination device, a plurality of seats having a backrest portion may be formed and arranged in a cascade in the fuselage, the aircraft member may be the backrest portion, a panel connector that attaches the organic EL illumination panel to the backrest portion to be capable of being opened and closed between a closed state in which the transparent substrate of the organic EL illumination panel faces a back surface of the backrest portion and an opened state in which the transparent substrate of the organic EL illumination panel forms an angle with respect to the back surface may be included, and the organic illumination panel may have a luminance of 2000 $cd/m^2$ or more.

In the illumination device, it is possible to illuminate a space between a passenger sitting on the seat and the backrest portion of a seat in front of him or her at a desired illuminance without substantially reducing the space. Also, in the illumination device, since the organic EL illumination panel is installed to be relatively close to the passenger sitting on the seat, it is possible to minimize diffusion of light to a passenger sitting on an adjacent seat.

In this case, the panel connector may swingably attach the organic EL illumination panel to the backrest portion with respect to a virtual axis parallel to a floor surface, and the device may include a light shielding plate attached at both ends of the organic EL illumination panel in a direction in which the virtual axis extends to be opened and closed between a closed state in which the light shielding plate faces the transparent substrate and an opened state in which the light shielding plate forms an angle with respect to the transparent substrate.

In the illumination device, it is possible to reliably prevent diffusion of the light from the organic EL illumination panel in a direction in which the virtual axis extends.

In this case, it is preferable for the illumination device to include a switch that drives the organic EL illumination panel when the organic EL illumination panel is changed from the closed state to the opened state, and stops driving of the organic EL illumination panel when the organic EL illumination panel is changed from the opened state to the closed state.

Further, in the illumination device, a shade that shades light from a window to an inside of the aircraft may be arranged on the inner side of the window in the fuselage, the aircraft member may be the shade, and the organic EL illumination panel may be installed on an inner side of the shade so that the transparent substrate is directed to the inside of the aircraft, and have a luminance of 300 $cd/m^2$ or more.

In the illumination device, it is possible to prevent the inside of the aircraft from darkening without substantially reducing a space on the inner side of the window even if the shade is lowered when sunlight enters the aircraft through the window. Further, since the organic EL illumination panel has a sense of depth when emitting the light, unlike a fluorescent lamp, it is possible to prevent passengers from feeling stifled or cramped when the shade is lowered.

Further, in the illumination device, an inner window frame member that covers a vicinity of a window on the inner side may be arranged in the fuselage, the aircraft member may be the inner window frame member, and the organic EL illumination panel may be installed on an inner side of the inner window frame member so that the transparent substrate is directed to the inner side, and have a luminance of 300 $cd/m^2$ or more.

In the illumination device, it is possible to prevent the inside of the aircraft from darkening without substantially reducing space on the inner side of the window even if the shade is lowered when sunlight enters the aircraft through the window.

Further, in the illumination device, a mirror having a transparent plate may be arranged in a lavatory of the fuselage, the aircraft member may be the mirror, and the organic EL illumination panel may be installed on the transparent plate of the mirror so that the transparent substrate is directed to a reflection direction side of the mirror, and have a luminance of 2000 $cd/m^2$ or more.

In the illumination device, it is possible to illuminate the space of the mirror toward the inside of the lavatory at a desired illuminance without substantially reducing the space.

Further, in the illumination device, a closet may be arranged in a galley of the fuselage, the aircraft member may be the closet, and the organic EL illumination panel may be installed inside of the closet so that the transparent substrate is directed to the inside, and have a luminance of 300 $cd/m^2$ or more.

In the illumination device, it is possible to illuminate the inside of the closet at a desired illuminance without substantially reducing the inside of the closet.

Further, in the illumination device, the organic EL illumination panel may form a sign light including a sheet with a figure or text indicating content of which to inform a passenger.

In the illumination device, it is possible to light and display content of which to inform a passenger without substantially reducing space in the aircraft.

In this case, a figure or text informing a passenger of an emergency exit may be displayed on the sheet, and the organic EL illumination panel may have a luminance of 86 $cd/m^2$ or more.

Further, a partition member that partitions an internal space may be arranged in the fuselage, the aircraft member may be the partition member, and the organic EL illumination panel may be installed on an internal space in the fuselage partitioned by the partition member so that the transparent substrate is directed to the internal space side, and have a luminance of 1.3 $cd/m^2$ or more.

Further, in each above-described illumination device, a curved surface may be formed in the aircraft member, and the organic EL illumination panel may be provided along the curved surface of the aircraft member on the curved surface.

Further, in each above-described illumination device, the organic EL illumination panel may include a light storing layer including a light storing material.

In the illumination device, it is possible to continuously provide illumination even during an emergency in which all power supply in the aircraft fails.

In this case, the organic EL illumination panel may include a heat radiation plate arranged on the side opposite to the one electrode with respect to the other electrode, the pair of electrodes may both be transparent electrodes, and the light storing layer may be arranged between the other electrode and the heat radiation plate.

Advantageous Effects of Invention

According to the illumination device described above, it is possible to illuminate the internal space of the fuselage without substantially reducing the internal space of the fuselage.

BRIEF DESCRIPTION OF DRAWINGS

FIG. 16 is an illustrative diagram illustrating a configuration of an illumination device in the sixth embodiment of the present invention.

FIG. 28 is an illustrative diagram illustrating a configuration of an illumination device in the tenth and eleventh embodiments of the present invention.

DESCRIPTION OF EMBODIMENTS

Figure 1:
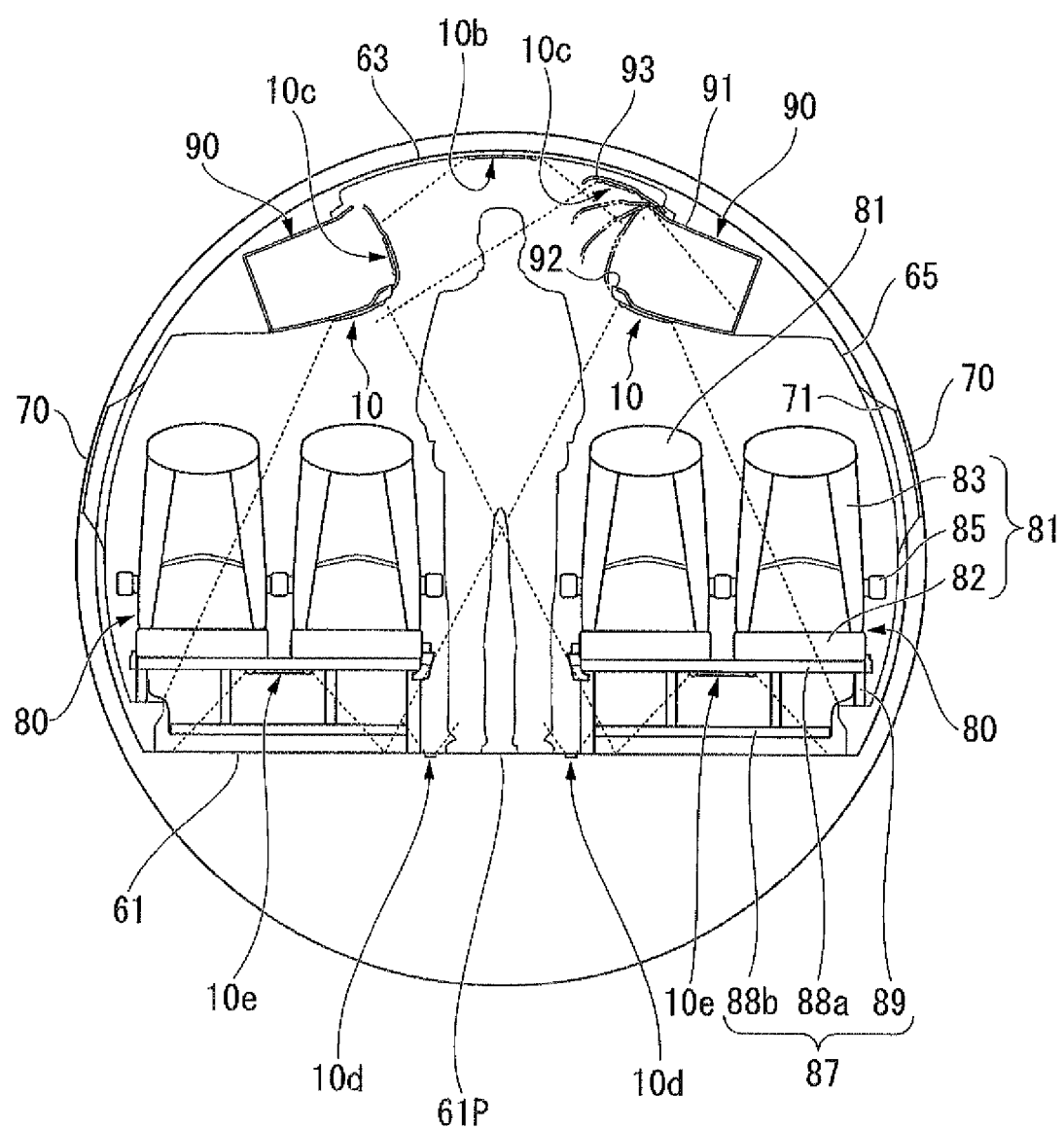
FIG. 1 is a cross-sectional view of a fuselage in an embodiment of the present invention.

Hereinafter, an illumination device according to various embodiments of the present invention will be described in detail with reference to the drawings.

An illumination device according to each embodiment of the present invention is installed in an aircraft member arranged in a fuselage of a passenger aircraft. First, a simple configuration of a cabin of the passenger aircraft in which an illumination device is installed will be described using FIG. 1.

The cabin is defined by a floor member 61, a ceiling member 63, a sidewall member 65, a window 70, and an inner window frame member 71 that covers the vicinity of this window 70. In this cabin, a seat device 80 installed on the floor member 61, and a baggage rack 90 installed in a ceiling above the seat device 80 are arranged. Each of the floor member 61, the ceiling member 63, the sidewall member 65, the inner window frame member 71, the seat device 80, and the baggage rack 90 are the above-described aircraft member.

The seat device 80 includes two seats 81, and a support 87 that supports the seats 81. Each seat 81 includes a seat portion 82 on which a passenger sits, a backrest portion 83 on which the back of a passenger leans, and an armrest portion 85 on which an arm of a passenger rests. The support 87 includes a seat portion support beam 88a arranged beneath the seat portion 82 of each of the two seats 81, legs 89 provided in both ends of the seat portion support beam 88a, and a leg connection beam 88b that connects the legs 89.

Two seat devices 80 are arranged at an interval in a right and left direction of the passenger aircraft in the cabin. Furthermore, a set of two seat devices 80 arranged at an interval in a right and left direction are arranged in a longitudinal direction of the passenger aircraft in the cabin. A cabin aisle 61p is formed between the two seat devices 80 arranged in the right and left direction on the floor member 61.

The baggage rack 90 is arranged above each of the sets of two seat devices 80 arranged in the right and left direction. The baggage rack 90 includes a rack body 91 having an opening 92 provided on an aisle side, and a cover 93 that closes the opening 92 of the rack body 91.

First Embodiment

An illumination device according to a first embodiment of the present invention will be described using FIGS. 1 to 5.

Figure 4:
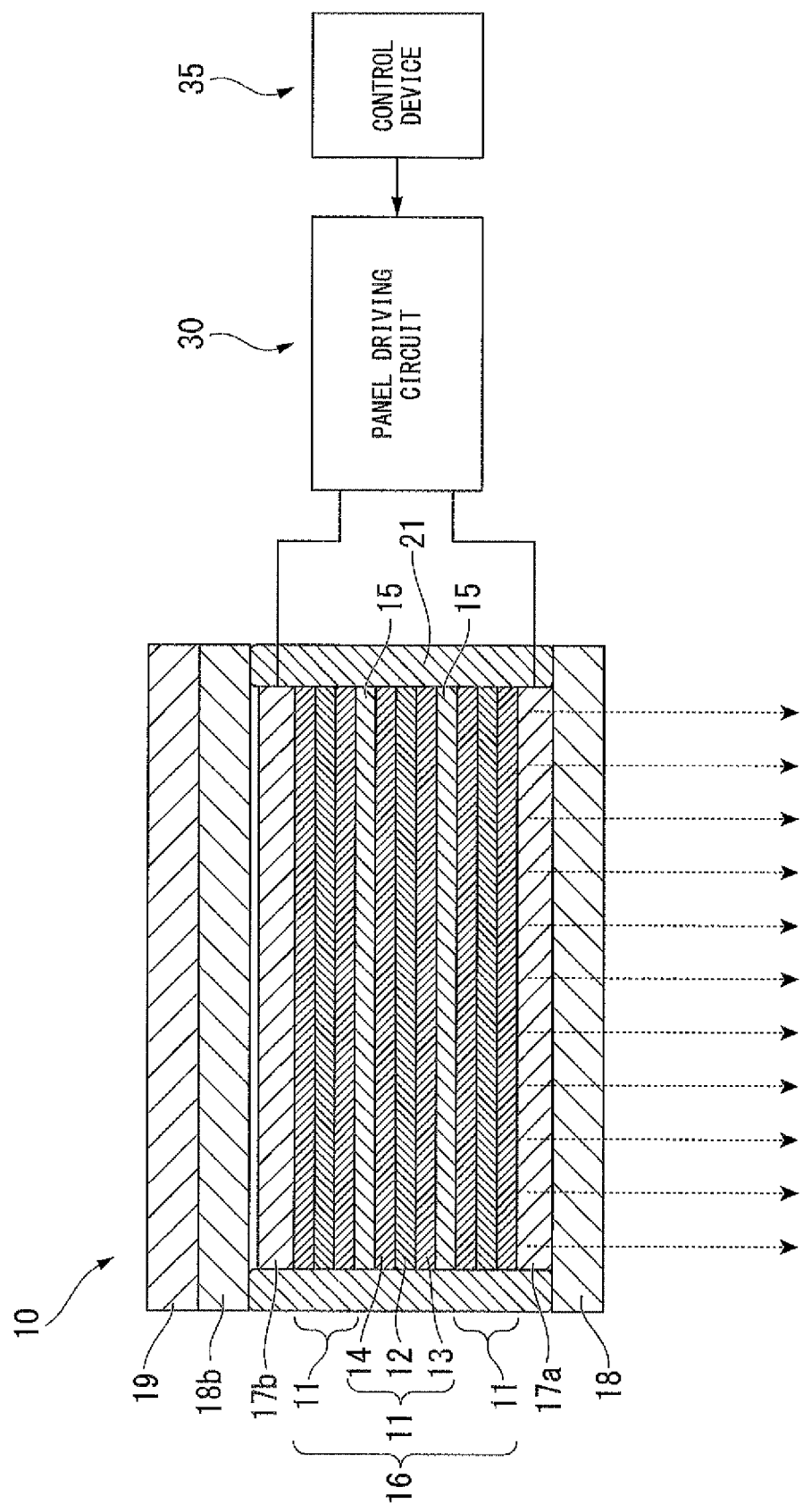
FIG. 4 is an illustrative diagram illustrating a configuration of an illumination device in the first embodiment of the present invention.

The illumination device of this embodiment includes an organic EL illumination panel 10, and a panel driving circuit 30 that drives this organic EL illumination panel 10 according to an instruction from a control device 35, as illustrated in FIG. 4.

The organic EL illumination panel 10 includes a plurality of light emitting units 11, a charge generation layer 15 arranged between the plurality of light emitting units 11, a pair of electrodes (a positive electrode 17a and a negative electrode 17b) which supply power from the panel driving circuit 30 to a stacked body 16 including the light emitting units 11 and the charge generation layers 15, a transparent substrate 18 arranged on a side opposite to the negative electrode 17b side of the positive electrode 17a with respect to the positive electrode 17a, a sealing substrate 18b arranged on a side opposite to the positive electrode 17a side of the negative electrode 17b with respect to the negative electrode 17b, a heat radiation plate 19 arranged on a side opposite to the positive electrode 17a side with respect to the sealing substrate 18b, and a sealing member 21 that seals an outer periphery of the stacked body 16 and the electrodes 17a and 17b.

The light emitting unit 11 includes a light emitting layer 12 including a fluorescent organic material or a phosphorescent organic material, a hole transport layer 13 that transports holes, and an electron transport layer 14 that transports electrons. The plurality of layers 12, 13, and 14 are stacked in a stacking direction of the above-described stacked body 16. Further, in this embodiment, the light emitting unit 11 includes the light emitting layer 12, the electronic transport layer 14, and the hole transport layer 13, but this embodiment of the present invention is not limited thereto. For example, the light emitting unit may include a hole transport layer and a light emitting layer, may include a hole injection layer, a hole transport layer, a light emitting layer, and an electron transport layer, or may include a hole injection layer, a hole transport layer, a light emitting layer, an electron transport layer, and an electron injection layer.

The positive electrode 17a is, for example, a transparent electrode formed of ITO (Indium Tin Oxide) or the like. Further, the negative electrode 17b is a reflection electrode formed of Ag, Al or the like. The heat radiation plate 19 is formed of, for example, an Al plate of which the surface is subjected to an insulation process. The transparent substrate 18 is formed of a transparent glass plate, a plastic plate or the like. The sealing substrate 18b functions as a cap for sealing the negative electrode 17b side in the stacking direction of the stacked body 16 and the electrodes 17a and 17b. The sealing substrate 18b is formed of a glass plate, a plastic plate or the like. In the stacking direction of the stacked body 16, a slight gap is secured between the sealing substrate 18b and the negative electrode 17b. This gap is filled with a moisture absorbent. Further, for example, the gap may be filled with an inert gas such as nitrogen or silicone oil in place of the moisture absorbent.

The sealing member 21 is provided to prevent the stacked body 16 from deteriorating due to external oxygen or water. This sealing member 21 is arranged, for example, on the outer periphery of the stacked body 16 and the electrodes 17a and 17b between the transparent substrate 18 and the sealing substrate 18b, and bonds the substrates 18 and 18b.

In this embodiment, a multi-photoemission (MPE) structure having the plurality of light emitting units 11 and the charge generation layer 15 arranged between the plurality of light emitting units 11 is adopted. The organic EL illumination panel may include one light emitting unit 11. However, in this embodiment, the MPE structure is adopted as an illumination device of the passenger aircraft so as to increase reliability and achieve a long lifespan and low power consumption.

It is not necessary for the fight emitting layers 12 of the plurality of light emitting units 11 in the MPE structure to be the same among the light emitting units 11. The light emitting layer 12 of each of the plurality of light emitting units 11 in the MPE structure may be a combination of a light emitting layer 12 for red light emission, a light emitting layer 12 of green light emission, and a light emitting layer 12 for blue light emission or a combination of a light emitting layer 12 for orange light emission and a light emitting layer 12 for blue light emission. The light emitting layer 12 emits, as a whole, white light or the like according to light color mixture action due to the combination. Further, two light emitting layer 12 may be provided one light emitting unit 11, one light emitting layer 12 of two light emitting layer 12 is for one of red, green, and blue, another light emitting layer 12 is for one of remaining two color, and an additional light emitting layer 12 for the remaining color may be provided in the other light emitting unit 11 in order to realize white light emission through a combination of the light emitting units 11. Furthermore, a light emitting layer 12 for red, green, and blue may be provided in one light emitting unit 11 to realize white light emission with the single unit, and a plurality of light emitting units 11 may be combined to constitute a stacked structure.

New materials for each layer constituting the light emitting unit 11 are being developed one by one. Therefore, a known material may be appropriately selected and used as the material of each layer constituting the light emitting unit 11. Further, the organic material of the light emitting layer 12 may be either a low-molecule-based material or a polymer-based material. Further, if a phosphorescent organic material is used as the organic material of the light emitting layer 12, it is possible to obtain 4 times the luminous efficiency of a fluorescent organic material.

For example, an electrical insulating layer having a specific resistance of $1.0 \times 10^2$ Ω·cm or more or a semiconductor layer or a conductive layer having a specific resistance of $1.0 \times 10^2$ Ω·cm or less is used as the charge generation layer 15. This charge generation layer 15 includes one layer or a plurality of layers. Each layer of the charge generation layer 15 is formed of a single organic material, an inorganic oxide (molybdenum oxide, vanadium oxide or the like) or a mixture thereof. The charge generation layer 15 may have a structure in which an organic layer doped with an n type organic material and an organic layer doped with a p type organic material are stacked. Further, the charge generation layer 15 may have a structure in which an electrical insulating layer having a specific resistance of $1.0 \times 10^2$ Ω·cm or more is inserted between an organic layer doped with an n type organic material and an organic layer doped with a p type organic material so as to suppress interaction therebetween so that the charge generation layer 15 can perform good delivery of a current.

In the organic EL illumination panel 10 having an MPE structure, the same current flows in the respective light emitting units 11, and each light emitting unit 11 contributes to emission. Thus, it is possible to emit much light even with less current in comparison with a normal organic EL illumination panel including one light emitting unit 11.

For example, in the organic EL illumination panel 10 having three light emitting units 11, it is possible to emit the same light as in an organic EL illumination panel including one light emitting unit 11 even when a current flowing in the organic EL illumination panel 10 is reduced to ⅓.

Thus, in the organic EL illumination panel 10 having the MPE structure, the same light amount is obtained with a current lower than the current in the organic EL illumination panel 10 including one light emitting unit 11, and thus a load of each organic layer is reduced. As a result, it is possible to increase reliability, and achieve a long lifespan and low power consumption, as described above.

Figure 5:
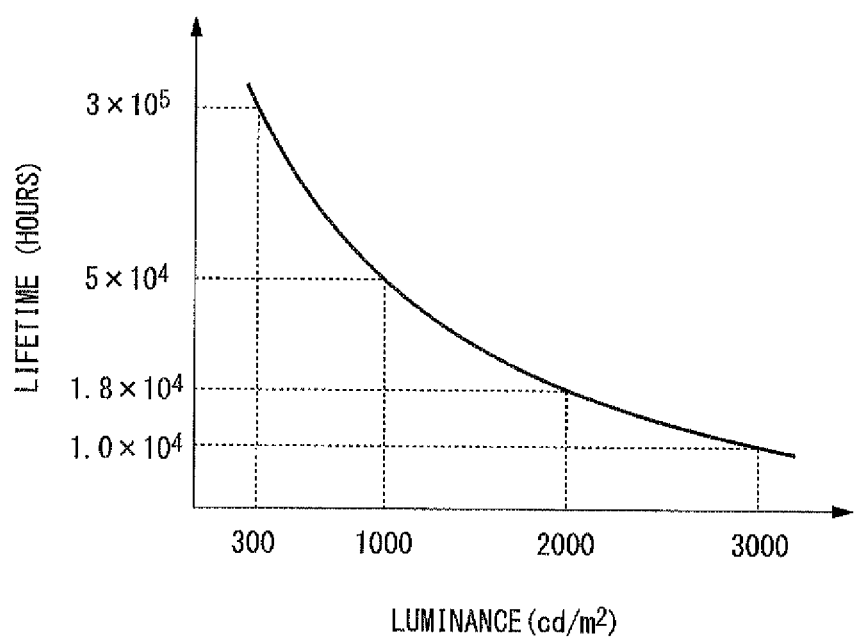
FIG. 5 is a graph illustrating a relationship between luminance and lifespan of an organic EL illumination panel in an embodiment of the present invention.

In current technology, when time until the luminance becomes 70% of the initial luminance is defined as a lifespan, the lifespan of the organic EL illumination panel 10 of which color temperature is a neutral white type in an MPE structure is about 300000 hours, about 50000 hours, about 18000 hours, and about 10000 hours when an initial luminance is 300 cd/m$^2$, 1000 cd/m$^2$, 2000 cd/m$^2$, and 3000 cd/m$^2$, respectively, as illustrated in FIG. 5. Further, the lifespan of the organic EL illumination panel of which a color temperature is a bulb color type in the MPE structure is about 25000 hours, about 9000 hours, and about 5000 hours, when the initial luminance is 1000 cd/m$^2$, 2000 cd/m$^2$, and 3000 cd/m$^2$, respectively.

A thickness of each of the layers constituting the light emitting unit 11, a thickness of the charge generation layer 15 arranged between the light emitting units 11, and thicknesses of the positive electrode 17a and the negative electrode 17b are tens to hundreds of nm. Therefore, when a plurality of light emitting units 11 are included, the thickness of the stacked body is on the order of sub μm to μm. Further, a thickness of the transparent substrate 18 or the heat radiation plate 19 is about 0.5 to 0.9 mm. Therefore, a thickness of the organic EL illumination panel 10 can be 3 mm or less. Even when another layer, sheet, plate, or the like is added according to other design requirements, such as high rigidity of the organic EL illumination panel 10, the thickness of the organic EL illumination panel can be 5 mm or less.

With the organic EL illumination panel, various shapes such as a square, a rectangle, a circle, or a special symbolic shape can be realized as its shape according its purpose or installation place. Further, with the organic EL illumination panel, for example, various sizes such as a small organic EL illumination panel such as 5×5 cm$^2$ and a relatively large organic EL illumination panel such as 10×10 cm$^2$, 15×15 cm$^2$ or 30×30 cm$^2$ can be realized as its size when the panel is a square. Further, various sizes such as a small organic EL illumination panel such as 3×15 cm$^2$ and a relatively large organic EL illumination panel such as 6×30 cm$^2$, 7.5×30 cm$^2$ or 10×30 cm$^2$ can be realized as its size when the panel is a rectangle. Further, the organic EL illumination panel 10 includes, in an outer peripheral portion of the transparent substrate 18, a member such as a frame including wirings for supplying power from the panel driving circuit 30 to the pair of electrodes 17a and 17b. Therefore, about 70% of the external size of the organic EL illumination panel 10 becomes a light emitting area.

In the organic EL illumination device, the driving circuit is generally provided integrally with this organic EL illumination panel behind the organic EL illumination panel as described above. However, in this embodiment, the organic EL illumination panel 10 and the panel driving circuit 30 are installed in separate places away from each other.

Figure 2:
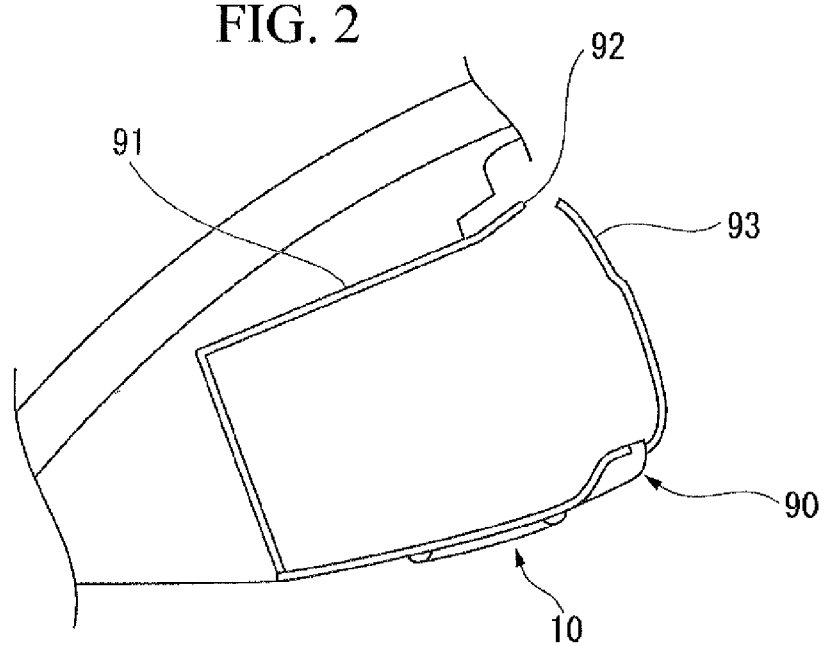
FIG. 2 is a cross-sectional view of an organic EL illumination panel and a baggage rack in a first embodiment of the present invention.
Figure 3:
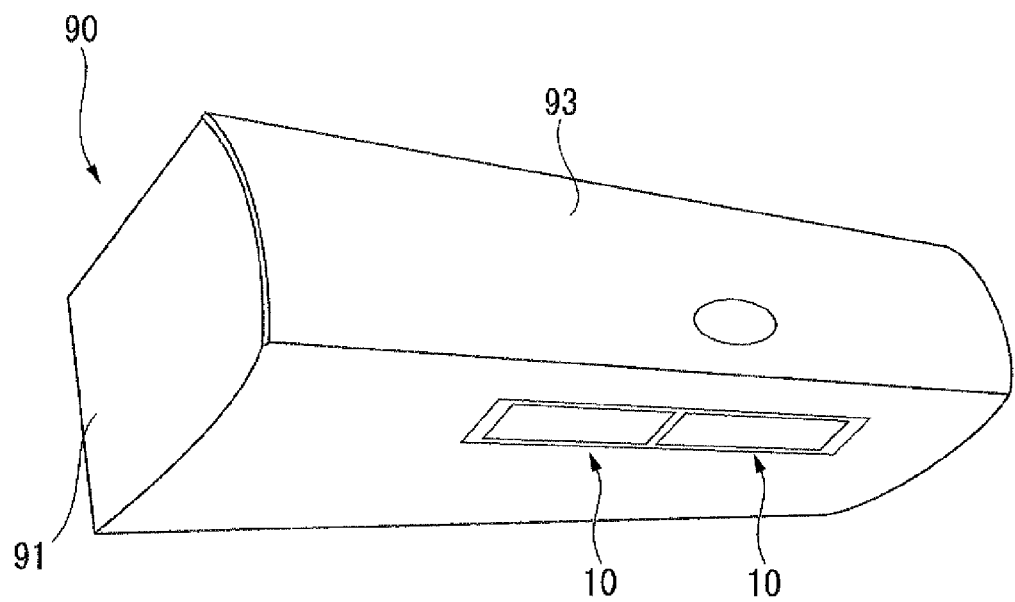
FIG. 3 is a perspective view of the baggage rack in the first embodiment of the present invention.

In this embodiment, the organic EL illumination panel 10 is installed in a surface on the floor side in the rack body 91 of the baggage rack 90 so that the transparent substrate 18 of the organic EL illumination panel 10 is directed to the floor, as illustrated in FIGS. 1 to 3. Further, the panel driving circuit 30 that drives this organic EL illumination panel 10 may be provided, for example, in a position relatively close to the organic EL illumination panel 10, such as a side plate facing the opening 92 in the rack body 91 or between the baggage rack 90 and the ceiling, but may be provided in a position relatively far from the organic EL illumination panel 10, such as a member defining a baggage compartment.

The organic EL illumination panel 10 is curved along and fixed to a curved surface on the floor side of the rack body 91 with an adhesive medium such as an adhesive or a double-sided tape or a fixture such as screws. Further, when the organic EL illumination panel 10 is fixed to the curved surface and a radius of curvature of this surface is relatively large, a glass plate may be used as the transparent substrate 18. On the other hand, if the radius of curvature is relatively small, a highly flexible plastic plate is preferably used instead of the glass plate. Further, even in embodiments to be described hereinafter, when the surface to which the organic EL illumination panel is fixed is curved, this organic EL illumination panel may be curved along and fixed to the surface.

Incidentally, illuminance criteria of cabin illumination for a passenger aircraft are determined as industry standards in SAE Aerospace, which is a series in the field of aerospace published by the Society of Automotive Engineers (hereinafter referred to as SAE) in the USA. In "Aerospace Information Report 512" (hereinafter, AIR 512) from SAE Aerospace, illuminance in a seat space of a lower surface of a baggage rack is defined as 53.82 lx or more at the time of boarding and 21.53 lx or more during a night flight.

In this embodiment, in order to satisfy the above illuminance criteria in a space 1 m directly under the baggage rack 90, for example, two organic EL illumination panels 10 having a luminance of 1000 to 2000 cd/m$^2$ and an external size of 7.5×30 cm$^2$ are installed side by side in a longitudinal direction in the surface on the floor side of the baggage rack 90.

The luminance and the external size of the organic EL illumination panel 10 illustrated above were obtained using Equations (1) and (2) below.

Further, luminous intensity I (cd) of the light source and illuminance E (lx) of a portion illuminated by light from the light source are inversely proportional to a square of a distance R (m), as illustrated in Equation (1) below.

$$E = I/R^2 \quad (1)$$

Further, the luminous intensity I (cd) of the light source is a product of luminance L (cd/m²) of the light source and an area S (m²) of an appearance viewed directly under the light source, as shown in Equation (2) below.

$$I = L \cdot S \quad (2)$$

Further, Equation (1) is an equation used for calculation of the illuminance in a point light source, but is applied to a case of an organic EL illumination panel which is a planar light source for simple calculation. Further, as the area S (m²) of an appearance viewed directly under the light source, the light emitting area (m²) of the organic EL illumination panel is used instead. Further, since this light emitting area is about 70% of the external size of the organic EL illumination panel 10 as described above, 70% of the external size is the light emitting area.

If the initial luminance of the organic EL illumination panel 10 is 2000 cd/m², the lifespan of the organic EL illumination panel 10 is about 18000 hours if the organic EL illumination panel 10 is a neutral white type, and about 9000 hours if the organic EL illumination panel 10 is a bulb color type as described above. Thus, such an organic EL illumination panel 10 is an alternative to a fluorescent lamp having a lifespan of about 10000 hours on an illuminance basis.

As described above, in this embodiment, since the organic EL illumination panel 10 having a thickness of 5 mm or less is installed on the floor side of the baggage rack 90, it is possible to illuminate the seat portion 82 or the floor surface without substantially reducing space between the baggage rack 90 and the seat portion 82 of the seat 81 directly under the baggage rack 90 and a space between the baggage rack 90 and the floor surface directly under the baggage rack 90. Further, in existing general passenger aircrafts, in order to avoid substantially reducing the space between the baggage rack and the seat portion of the seat directly under the baggage rack, an illumination device such as a fluorescent lamp is not installed in a surface on the floor side of the baggage rack. Therefore, in the existing general passenger aircrafts, for example, a reading light is used instead so as to brighten the baggage rack and the seat portion of the seat directly under the baggage rack.

Modification Example of First Embodiment

Next, a modification example of the first embodiment described above will be described using FIGS. 6 and 7.

Figure 6:
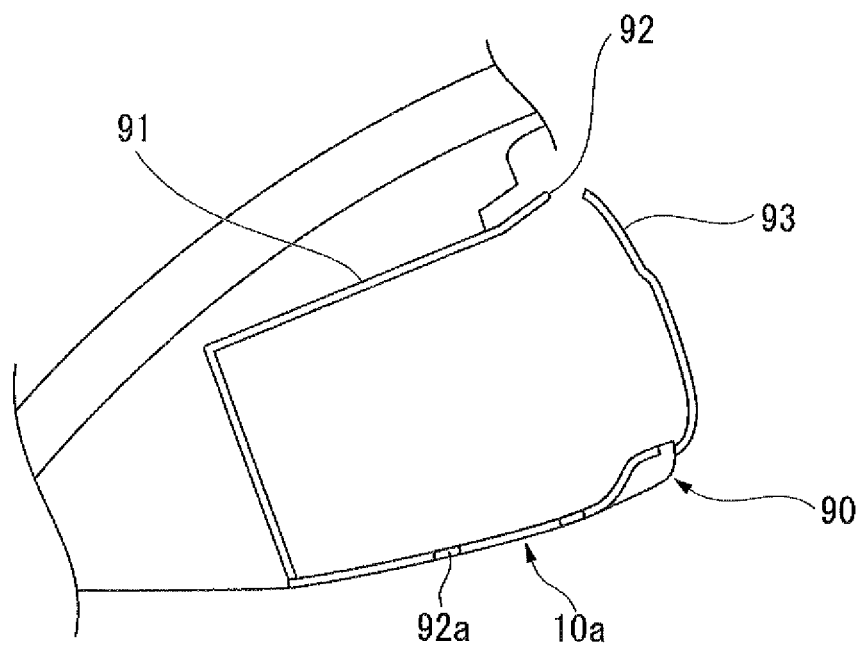
FIG. 6 is a cross-sectional view of an organic EL illumination panel and a baggage rack in a modification example of a first embodiment of the present invention.

In an illumination device of this modification, a through opening 92a or a recessed portion is formed in a rack plate on the floor side in the rack body 91 of the baggage rack 90, as illustrated in FIG. 6. In this modification example, the organic EL illumination panel 10a is installed in the rack plate on the floor side in the rack body 91 so that the transparent substrate 18 is directed to the floor side.

Even in this modification example, since the organic EL illumination panel 10a is installed on the floor side of the baggage rack 90, it is possible to obtain the same effects as those in the first embodiment described above.

Figure 7:
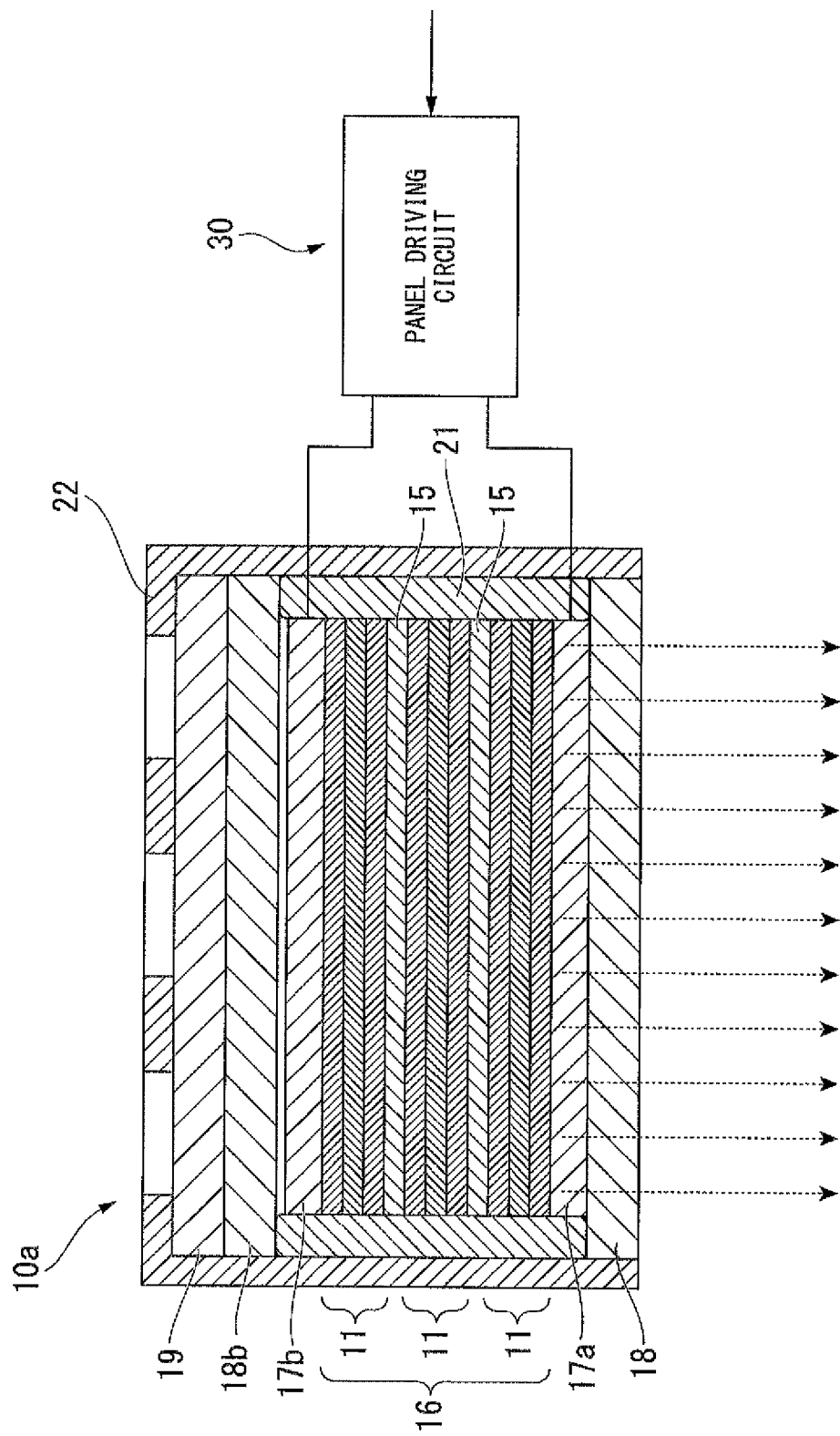
FIG. 7 is an illustrative diagram illustrating a configuration of an illumination device in the modification example of the first embodiment of the present invention.

Further, when the through opening 92a is formed in the rack plate on the floor side in the rack body 91 of the baggage rack 90 and the organic EL illumination panel 10a is inserted into the through opening 92a, it is necessary to secure relatively high rigidity since a load of baggage in the baggage rack 90 is applied to the organic EL illumination panel 10a. Therefore, in this case, it is preferable to collect the transparent substrate 18, the heat radiation plate 19, and the plurality of light emitting units 11 arranged therebetween, and provide a frame 22 that covers outer peripheries thereof and a back surface side of the heat radiation plate 19, as illustrated in FIG. 7. Further, in the frame 22, a through-hole may be formed in a portion covering the back surface side of the heat radiation plate 19 so as to secure a heat radiation effect of the heat radiation plate 19. Further, even when the frame 22 is provided to secure relatively high rigidity, the thickness of the organic EL illumination panel 10a can be suppressed to 5 mm or less, as described above.

Second Embodiment

Next, an illumination device according to a second embodiment of the present invention will be described using FIGS. 1 and 8.

The illumination device of this embodiment includes an organic EL illumination panel, and a panel driving circuit that drives this organic EL illumination panel according to an instruction from a control device, similarly to the first embodiment.

The organic EL illumination panel and the panel driving circuit have the same structure as the structure shown in the first embodiment or its modification example.

Figure 8:
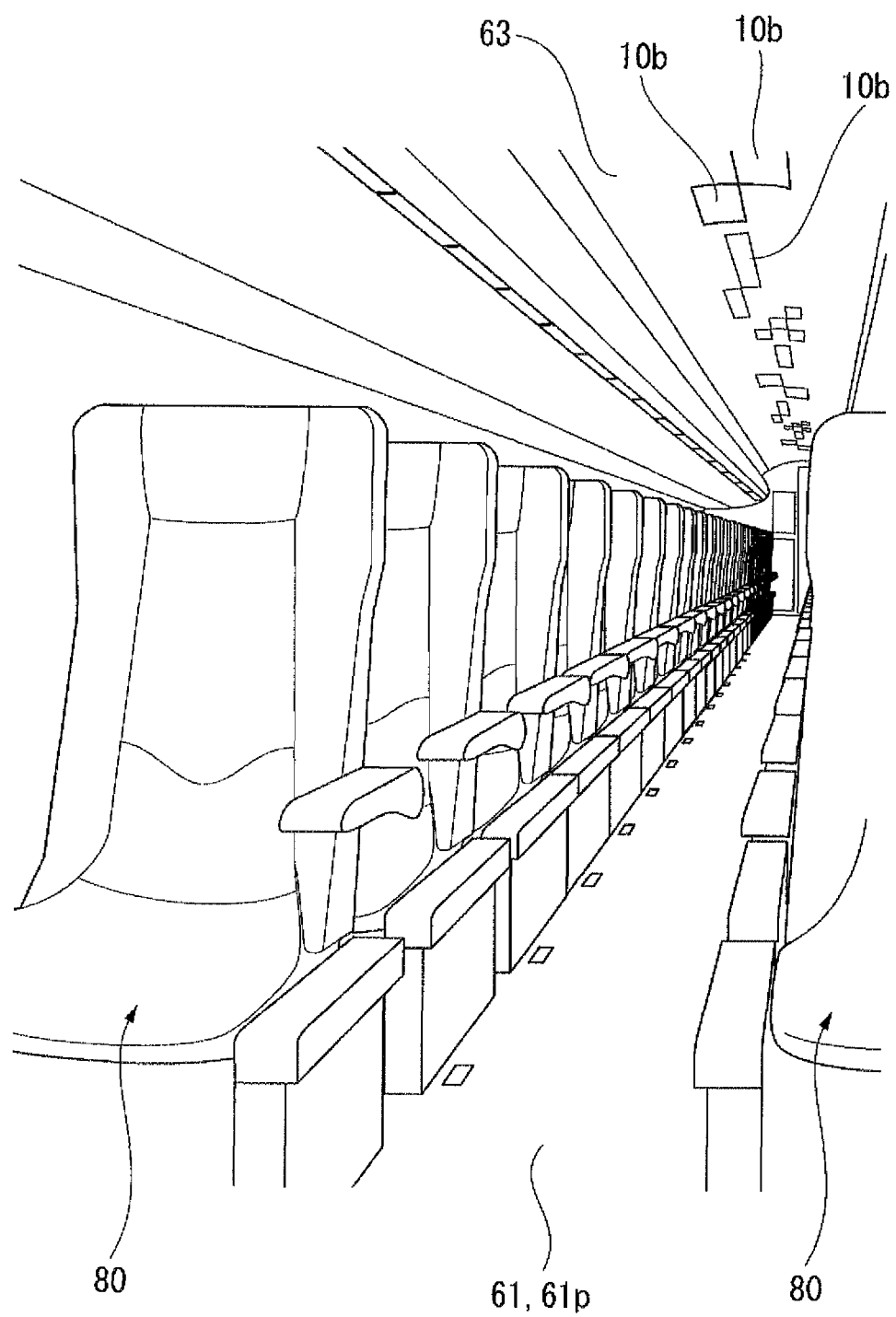
FIG. 8 is a perspective view of the inside of a cabin in a second embodiment of the present invention.

In this embodiment, the organic EL illumination panel 10b is installed in a portion of the ceiling member 63 defining the upper portion of the cabin, which is a portion directly above the aisle 61p so that a transparent substrate 18 of the organic EL illumination panel 10b is directed to the floor, as illustrated in FIGS. 1 and 8.

A plurality of organic EL illumination panels 10b are installed side by side in a longitudinal direction of the aisle 61p in a portion of the ceiling member 63 directly above the aisle 61p. The plurality of organic EL illumination panels 10b may be arranged linearly in the longitudinal direction of the aisle 61p, or may be arranged in the longitudinal direction of the aisle 61p and shifted to the right and left, as illustrated in FIG. 8, so as to improve design characteristics of an aircraft space.

Incidentally, in the above-described AIR 512, illuminance of the aisle is defined as 21.53 lx or more at the time of boarding and during a night flight and 1.08 lx or more at night when passengers are sleeping.

In this embodiment, in order to satisfy the illuminance criterion in a space 2 m directly under the ceiling surface, for example, the organic EL illumination panel 10b having a luminance of 2000 cd/m² or more and an external size of 10×30 cm² is installed in the ceiling member 63. The luminance and the external size of the organic EL illumination panel 10b illustrated here were obtained using Equations (1) and (2) above.

If an initial luminance of the organic EL illumination panel 10b is 2000 cd/m², a lifespan of the organic EL illumination panel 10b is about 18000 hours when the organic EL illumination panel 10b is a noon white type, and about 9000 hours when the organic EL illumination panel 10b is a bulb color type. Thus, such an organic EL illumination panel 10b is an alternative to a fluorescent lamp having a lifespan of about 10000 hours.

As described above, in this embodiment, since the organic EL illumination panel 10b having a thickness of 5 mm or less is installed in the ceiling member 63 directly above the aisle 61p, it is possible illuminate the floor or the like without substantially reducing the space between the ceiling surface and the floor directly under the ceiling surface, in other words, without substantially reducing an interval between a head of a passenger (including crew as well as passengers) walking on the aisle 61p and the ceiling surface.

Therefore, it is very preferable for this embodiment to be adopted in a small regional jet in which a space between a ceiling surface and a floor directly under the ceiling surface is small.

Further, a structure in which minute organic EL elements on a micron scale that emit light of single color such as red, green, and blue are arranged in parallel in a matrix form or a line form, in other words, the same structure as the organic EL indication panel, may be adopted as a structure of the organic EL illumination panel 10b. By adopting this structure, various colors, including white, can be represented due to three-color moderate color mixture effects, and a toning function can be enhanced. However, with this structure, since the number of wirings between the organic EL illumination panel 10b and the panel driving circuit increases, the wiring is complicated. Thus, it is preferable for the panel driving circuit that drives the organic EL illumination panel 10b to be installed near the organic EL illumination panel 10b.

Further, while the example in which the plurality of organic EL illumination panels 10b are installed only in the portion of the ceiling member 63 directly above the aisle 61p has been described above, the organic EL illumination panel 10b may be installed in the portion of the ceiling member 63 except for the portion directly above the aisle 61p.

Third Embodiment

Next, an illumination device according to a third embodiment of the present invention will be described using FIGS. 1, 9 and 10.

The illumination device of this embodiment includes an organic EL illumination panel, and a panel driving circuit that drives this organic EL illumination panel according to an instruction from a control device, similarly to each of the above-described embodiments. Even in this embodiment, the organic EL illumination panel and the panel driving circuit have the same structure as the structure illustrated in the first embodiment or its modification example.

Figure 9:
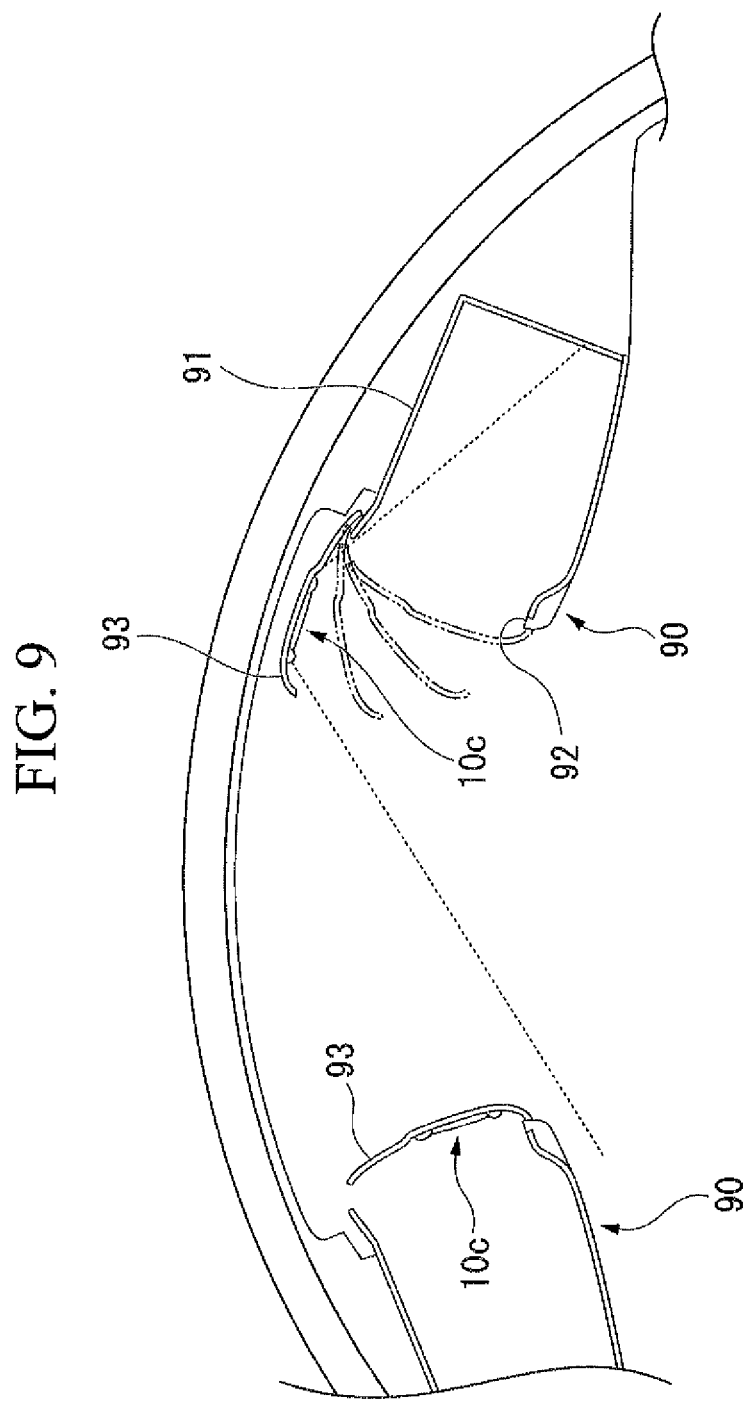
FIG. 9 is a cross-sectional view of an organic EL illumination panel and a baggage rack in a third embodiment of the present invention.
Figure 10:
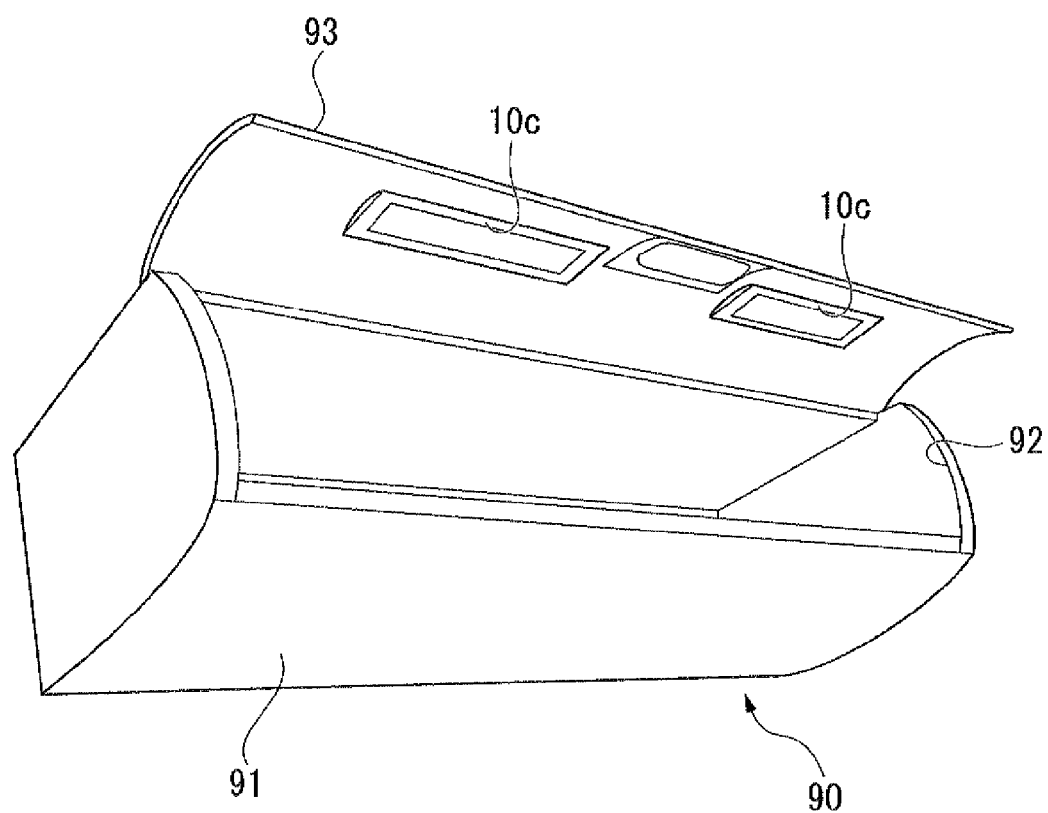
FIG. 10 is a perspective view of a baggage rack in the third embodiment of the present invention.

In this embodiment, an organic EL illumination panel 10c is installed on an inside side of the rack body 91 in the cover 93 of the baggage rack 90 so that a transparent substrate 18 is directed to the inner side of the rack body 91, as illustrated in FIGS. 1, 9 and 10.

Incidentally, in the above-described AIR 512, illuminance of the baggage rack is defined as 53.82 lx or more.

In this embodiment, in order to satisfy the illuminance criterion in a space 30 cm directly under the cover in a state in which the cover 93 of the baggage rack 90 is fully opened, for example, the organic EL illumination panel 10c having a luminance of 300 cd/m$^2$ or more and an external size of 7.5×30 cm$^2$ was assumed to be installed in this cover 93.

The luminance and the external size of the organic EL illumination panel 10c illustrated here were obtained by Equations (1) and (2) above. Further, when the initial luminance is 300 cd/m$^2$, a lifespan of the organic EL illumination panel 10c is about 300000 hours regardless of color temperature, as described above.

As described above, in this embodiment, since the organic EL illumination panel 10c having a thickness of 5 mm or less is installed on the inner side in the cover 93 of the baggage rack 90, the inside of the baggage rack 90 is illuminated without substantially reducing the internal space of the baggage rack 90. Therefore, in this embodiment, it is possible to improve visibility in the baggage rack 90 and contribute to shortening of time taken for confirmation of the inside of the baggage rack 90 by the crew and prevent passengers from forgetting their baggage. Further, when the cover 93 of the baggage rack 90 is fully opened, not only the internal space of the baggage rack 90 but also the aisle 61p can be illuminated, and loading and unloading of the baggage to and from the baggage rack 90 by passengers can be easily performed.

Further, in this embodiment, the organic EL illumination panel 10c may be turned on in response to the instruction from the control circuit in takeoff and landing time zones, or the organic EL illumination panel 10c may be turned on according to the opening and closing of the cover of the baggage rack 90. In this case, it is preferable that the opening and closing of the door (the cover of the baggage rack 90) be detected by a switch, and the organic EL illumination panel 10c be turned on when the door is opened and is turned off when the door is closed.

Fourth Embodiment

Next, an illumination device according to a fourth embodiment of the present invention will be described using FIGS. 1 and 11 to 13.

The illumination device of this embodiment includes an organic EL illumination panel, and a panel driving circuit that drives this organic EL illumination panel according to an instruction from a control device, similarly to each of the above-described embodiments.

Figure 11:
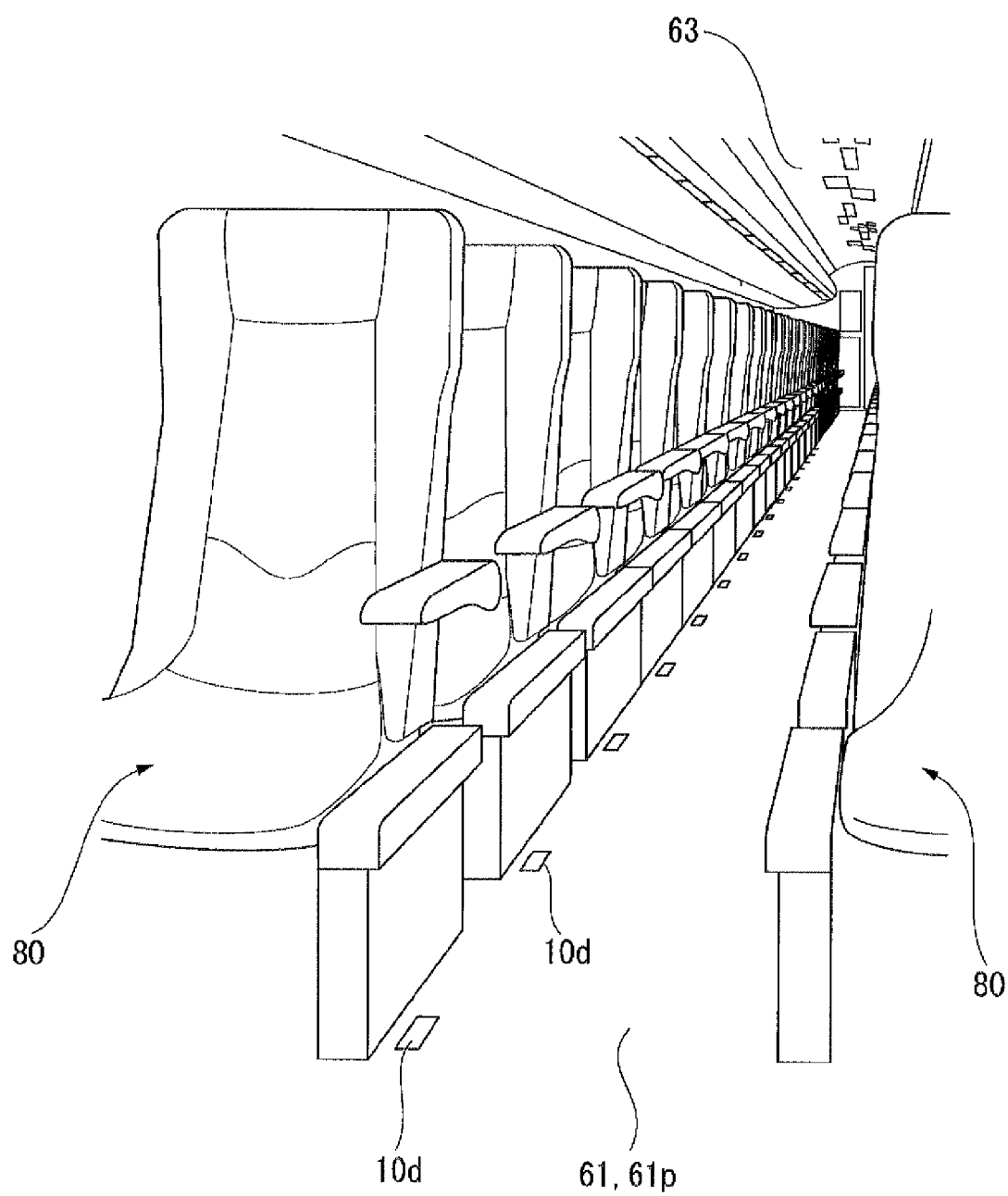
FIG. 11 is a perspective illustration in a cabin in a fourth embodiment of the present invention.

In this embodiment, an organic EL illumination panel 10d is installed in a portion of the floor member 61 defining the lower portion of the cabin, which is a portion of the aisle 61p, so that a transparent substrate 18 of the organic EL illumination panel 10d is directed to the ceiling, as illustrated in FIGS. 1 and 11. More specifically, the organic EL illumination panel 10d is installed in a position in the aisle 61p close to the seat on the aisle 61p side in one seat device 80 among the two seat devices 80 arranged at an interval in the right and left direction, and a position in the aisle 61p close to the seat on the aisle 61p side in the other seat device 80 located on an opposite side with the aisle 61p interposed therebetween.

Figure 12:
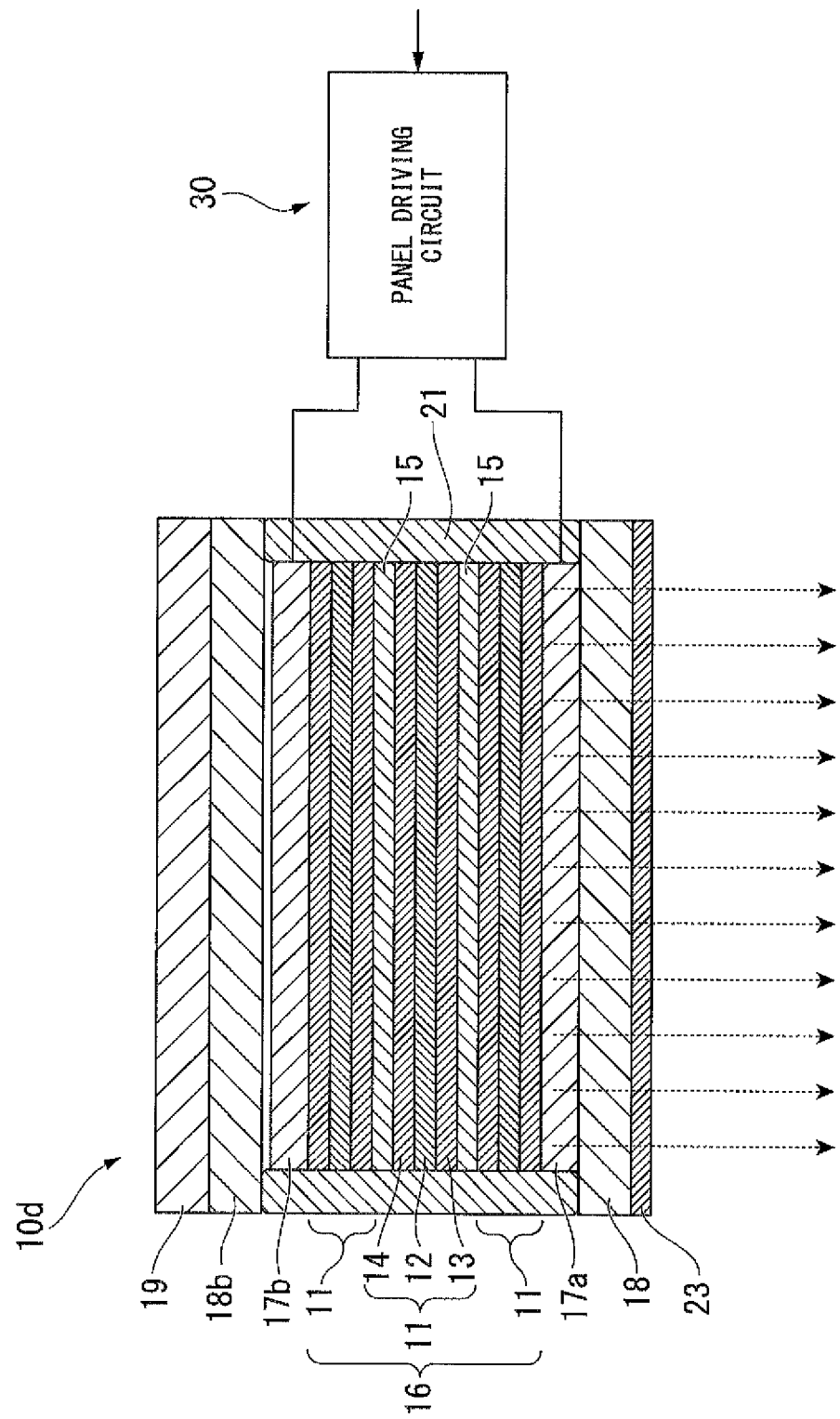
FIG. 12 is an illustrative diagram illustrating a configuration of an illumination device in the fourth embodiment of the present invention.

In the organic EL illumination panel 10d of this embodiment, a light storing layer 23 including a light storing material is added to the organic EL illumination panels 10 and 10a in the first embodiment and its modification example (FIGS. 4 and 7), as illustrated in FIG. 12. Examples of the light storing material include a zinc-sulfide-based material, a strontium-aluminate-based material, and an alumina-based oxide. This light storing layer 23 is formed of a paint containing a light storing material or a member in which a light storing material is covered with a sheet.

Since this light storing layer 23 has a small thickness and optical transparency, the light storing layer 23 may be arranged, for example, on a surface on the side opposite to the side of the transparent substrate 18 in which the positive electrode 17a is arranged or between the positive electrode 17a and the transparent substrate 18. Further, this light storing layer 23 may be arranged between the negative electrode 17b and the heat radiation plate 19. Specifically, the light storing layer 23 may be arranged between the negative electrode 17b and the sealing substrate 18b or between the sealing substrate 18b and the heat radiation plate 19. In this case, it is necessary for the negative electrode 17b to be a transparent electrode, similarly to the positive electrode 17a. Furthermore, when the light storing layer 23 is arranged between the sealing substrate 18b and the heat radiation plate 19, it is necessary for the sealing substrate 18b to be transparent. Further, it is preferable for a surface of the heat radiation plate 19 on the side in which the light storing layer 23 is arranged to be a reflection surface. Further, since the thickness of the light storing layer 23 is substantially the same as the thicknesses of the other layers, the thickness of this organic EL illumination panel 10d does not exceed 5 mm even when the light storing layer 23 is added.

Incidentally, in the above-described AIR 512, the illuminance in the aisle is defined as 21.53 lx or more at the time of boarding and during a night flight and 1.08 lx or more at night when passengers are sleeping.

In this embodiment, in order to satisfy the illuminance criterion in a space 10 cm directly above the floor surface, for example, the organic EL illumination panel 10d having a luminance of 15 cd/m² or more and an external size of 7.5×30 cm² was assumed to be installed in the floor member 61. The luminance and the external size of the organic EL illumination panel 10d illustrated here were obtained using Equations (1) and (2) above. Further, when the initial luminance is 15 cd/m², the lifespan becomes 300000 hours or more regardless of color temperature, as described above.

As described above, in this embodiment, since the organic EL illumination panel 10d having a thickness of 5 mm or less is installed in the aisle 61p as described above, the aisle 61p can be shown without disturbing walking of a passenger. Furthermore, since the organic EL illumination panel 10d includes the light storing layer 23, the organic EL illumination panel 10d can show the aisle 61p even in an emergency when all power in the aircraft is turned off, and thus the organic EL illumination panel 10d can serve as a guide light.

Figure 13:
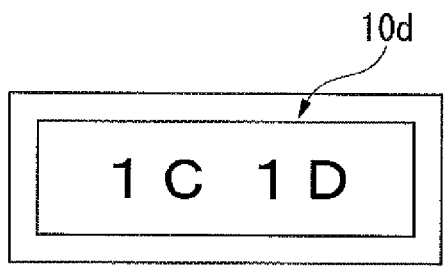
FIG. 13 is a front view of the organic EL illumination panel in the fourth embodiment of the present invention.

Further, the organic EL illumination panel 10d serves as a sign light for a seat number when a letter indicating the seat number is applied to the organic EL illumination panel 10d, as illustrated in FIG. 13. In this case, a sheet with a seat number may be added to the organic EL illumination panel 10d, as will be described in tenth and eleventh embodiments to be described using FIGS. 26 to 28. Generally, the seat number in the passenger aircraft is often attached to the baggage rack. Thus, when the organic EL illumination panel 10d functioning as the sign light for the seat number is installed in the aisle 61p, a small person or a child that cannot easily visually recognize the seat number on the baggage rack 90 can confirm the seat number when the aisle is crowded such as before takeoff and after landing.

Fifth Embodiment

Next, an illumination device according to a fifth embodiment of the present invention will be described using FIGS. 1 and 14.

The illumination device of this embodiment includes an organic EL illumination panel, and a panel driving circuit that drives this organic EL illumination panel according to an instruction from a control device, similarly to each of the above-described embodiments. Even in this embodiment, the organic EL illumination panel and the panel driving circuit have the same structure as the structure shown in the first embodiment or its modification example.

Figure 14:
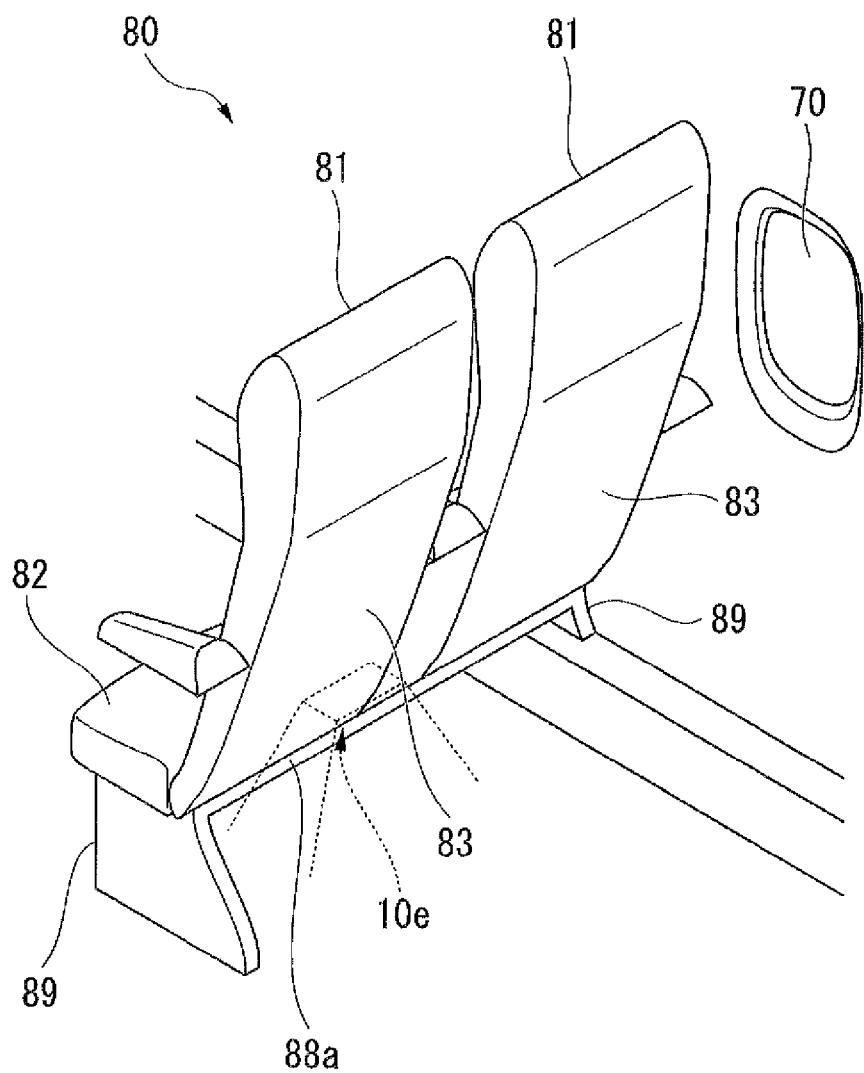
FIG. 14 is a perspective view of a seat device in a fifth embodiment of the present invention.

In this embodiment, the organic EL illumination panel 10e is installed on the floor side of the seat portion 82 of the seat device 80 and, more specifically, on the floor side of the seat portion support beam 88a supporting the seat portion 82 so that the transparent substrate 18 is directed to the floor, as illustrated in FIGS. 1 and 14.

Incidentally, in the above-described AIR 512, the illuminance in the aisle is defined as 21.53 lx or more at the time of boarding and during a night flight and 1.08 lx or more at night when passengers are sleeping, but illuminance in a footwell space of a lower portion of the seat is not defined in AIR 512. However, it is also preferable for the same illuminance as the illuminance in the aisle to be secured in the footwell space of the lower portion of the seat.

In this embodiment, in order to satisfy the illuminance criterion in the aisle 61p in a space 30 cm directly under the seat, for example, the organic EL illumination panel 10e having a luminance of 150 cd/m² or more and an external size of 7.5×30 cm² was assumed to be installed in the seat portion support beam 88a. The luminance and the external size of the organic EL illumination panel 10e illustrated here were obtained using Equations (1) and (2) above. Further, when the initial luminance is 150 cd/m², the lifespan is 300000 hours or more regardless of color temperature, as described above.

As described above, in this embodiment, since the organic EL illumination panel 10e having a thickness of 5 mm or less is installed on the floor side of the seat portion support beam 88a as described above, the lower portion of the seat can be illuminated without substantially reducing the space in the lower portion of the seat that is the baggage space or the footwell space. Therefore, in this embodiment, it is possible to improve visibility in the lower portion of the seat, and to easily perform loading or unloading of the baggage in the lower portion of the seat and easily perform confirmation of lost articles and obstacles at the time of passage. Furthermore, in this embodiment, since the footwell space becomes bright, the footwell space seems wider to the passenger, and the comfort of the passenger can be improved.

Further, in this embodiment, while the organic EL illumination panel 10e is provided in the seat portion support beam 88a, the organic EL illumination panel 10e may be directly installed on the surface on the floor side of the seat portion 82 of the seat 81 as long as light is not blocked by the seat portion support beam 88a.

Sixth Embodiment

Next, an illumination device according to a sixth embodiment of the present invention will be described using FIGS. 15A to 19.

The illumination device of this embodiment includes an organic EL illumination panel 10f, and a panel driving circuit 30 that drives this organic EL illumination panel 10f according to an instruction from a control device, similarly to each of the above-described embodiments, as illustrated in FIG. 16. Furthermore, the illumination device of this embodiment includes a panel connector 31 that attaches the organic EL illumination panel 10f to a back surface 83a of the backrest portion 83 in the seat 81, a light shielding plate 32 that blocks diffusion of the light from the organic EL illumination panel 10f, and a switch 33 that turns the organic EL illumination panel 10f ON or OFF.

The organic EL illumination panel 10f of this embodiment is basically the same as the organic EL illumination panel 10a (FIG. 7) that is the modification example of the first embodiment. The organic EL illumination panel 10f is a panel with relatively high rigidity having a frame.

Figure 15A:
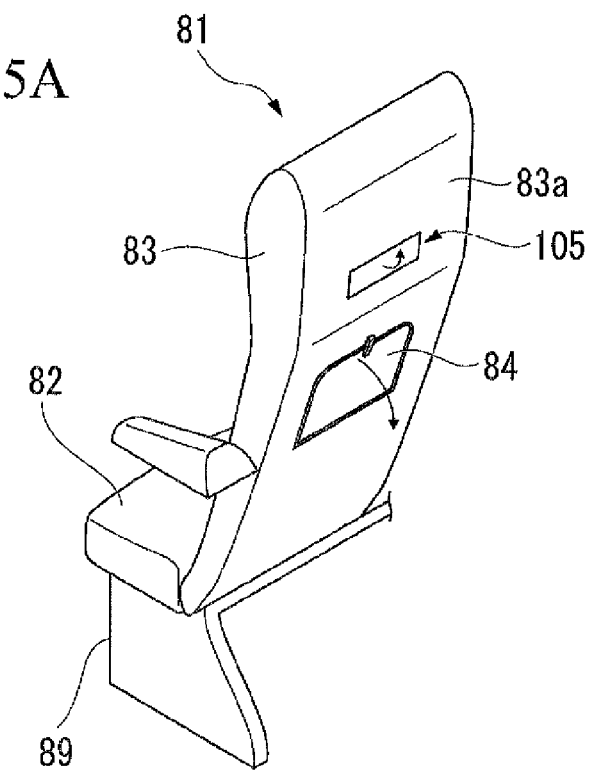
FIG. 15A is a perspective view of a seat and an organic EL illumination panel in a sixth embodiment of the present invention, and is a perspective view thereof when the organic EL illumination panel is in a closed state.
Figure 15B:
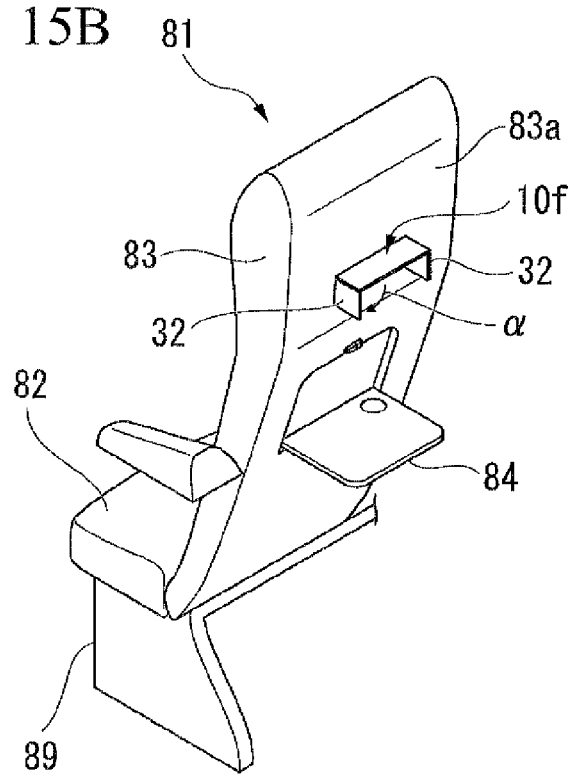
FIG. 15B is a perspective view of a seat and an organic EL illumination panel in the sixth embodiment of the present invention, and is a perspective view thereof when the organic EL illumination panel is in an opened state.

The organic EL illumination panel 10f is attached to the backrest portion 83 to be able to be opened or closed between a closed state in which the transparent substrate 18 of the organic EL illumination panel 10f faces the back surface 83a of the backrest portion 83 as illustrated in FIG. 15A and an opened state in which the transparent substrate 18 forms an angle with respect to the back surface 83a as illustrated in FIG. 15B by the above-described panel connector 31. For example, a friction hinge capable of maintaining an angle when the passenger causes the organic EL illumination panel 10f to be at such a desired angle with respect to the backrest portion 83 is adopted as the panel connector 31.

This panel connector 31 swingably attaches the organic EL illumination panel 10f to the backrest portion 83 with respect to a virtual axis along the back surface 83a of the backrest portion 83 and parallel to the floor surface, thereby realizing opening and closing of the organic EL illumination panel 10f. The organic EL illumination panel 10f is a rectangle in this example, and is attached to the backrest portion 83 by the panel connector 31 with one of a pair of long sides of the rectangle being parallel to the floor surface.

The above-described light shielding plate 32 is attached at both ends of the organic EL illumination panel 10f in a direction in which the above-described virtual axis extends, that is, a right and left direction of the fuselage, so as to be capable of opening and closing between a closed state in which the light shielding plate 32 faces the transparent substrate 18 and an opened state in which the light shielding plate 32 forms an angle with respect to the transparent substrate 18. In this embodiment, both of the end portions of the organic EL illumination panel 10f in the right and left direction of the fuselage are short sides of the rectangular organic EL illumination panel 10f.

The above-described switch 33 is arranged on the back surface side of the backrest portion 83 of the seat 81 and in a portion covered with the organic EL illumination panel 10f that is in the closed state. This switch 33 is provided in a wiring that connects the panel driving circuit 30 with the organic EL illumination panel 10f. This switch 33 detects opening or closing of the organic EL illumination panel 10f, electrically connects the panel driving circuit 30 with the organic EL illumination panel 10f in the opened state, and electrically disconnects the panel driving circuit 30 from the organic EL illumination panel 10f in the closed state.

In this embodiment, when the passenger sitting on his or her seat 81 reads or the like, the organic EL illumination panel 10f attached to the backrest portion 83 of the front seat 81 is caused to be in the opened state. When the organic EL illumination panel 10f enters the opened state, the switch 33 detects this state and electrically connects the organic EL illumination panel 10f with the panel driving circuit 30 to cause the organic EL illumination panel 10f to be in an ON state.

As an angle of the organic EL illumination panel 10f with respect to the backrest portion 83 increases, an amount of light reaching a hand of the passenger from the organic EL illumination panel 10f becomes large. Therefore, when the passenger desires his or her hand space (including the space on the table) to be bright, the passenger may increase the angle of the organic EL illumination panel 10f with respect to the backrest portion 83.

Further, for example, when it is desired that the light from the organic EL illumination panel 10f not reach an adjacent sleeping passenger, the angle of the light shielding plate 32 with respect to the organic EL illumination panel 10f may be appropriately adjusted.

Figure 19:
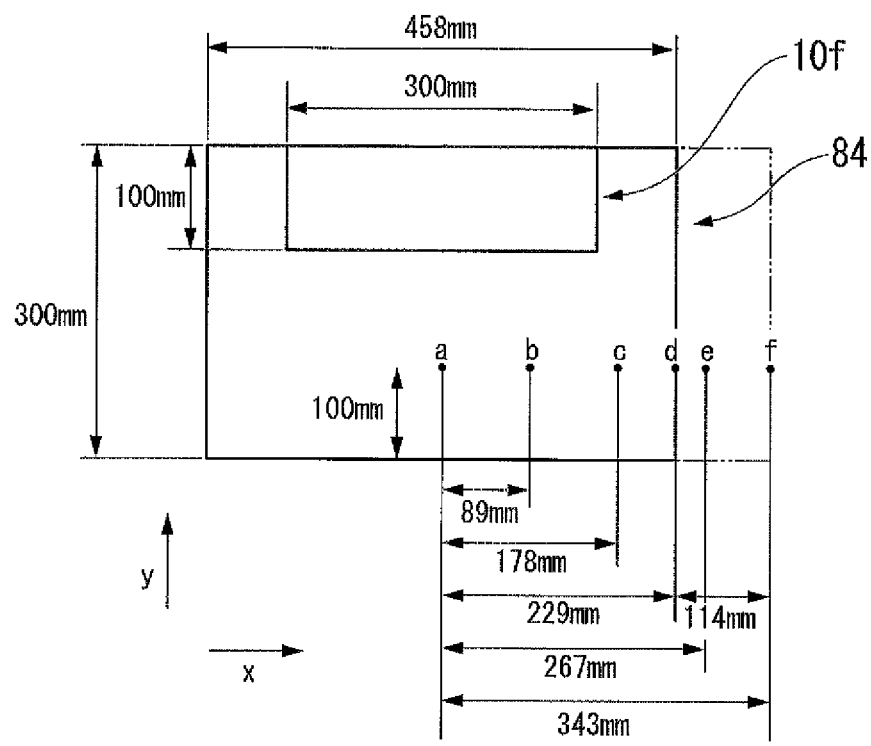
FIG. 19 is an illustrative diagram illustrating each position on a table surface and an extended surface when an organic EL illumination panel is used, and illuminance in each position in the sixth embodiment of the present invention.

Incidentally, in "Aerospace Recommended Practice 378" (hereinafter, ARP 378) from SAE Aerospace mentioned above, minimum illuminance 269 lx and maximum illuminance 591 lx are defined in the central position a of the table 84 within the table surface, and minimum illuminance 54 lx and maximum illuminance 215 lx are defined in the end position d of the table 84 within the table surface, as illustrated in FIG. 19.

Furthermore, a maximum of 16 lx is defined in the position f outside the table of 114 mm in a right and left direction from the end position d of the table 84 on the extended surface of the table surface. In ARP 378, illuminance criteria are given in units of fc, that is, footcandles, whereas all the illuminances here are given in units of lx using a conversion equation of 1 fc=10.75 lx.

In this embodiment, when a distance between the organic EL illumination panel 10f and the table surface is 30 cm in a state in which the organic EL illumination panel 10f having the external size of 10×30 cm$^2$ is opened to be parallel to the table surface, the luminance of the organic EL illumination panel 10f is 2000 cd/m$^2$ or more so as to satisfy the above illuminance criterion.

The luminances of the organic EL illumination panel 10f illustrated above were obtained using Equation (3) below. Specifically, first, a plurality of luminances are assumed as the luminances of the organic EL illumination panel, and illuminance $E_h$ in the plurality of positions a to f on the table surface and the extended surface in respective luminances is obtained using Equation (3) below. Then, it is determined whether the illuminance $E_h$ in the plurality of positions a to f on the table surface and the extended surface satisfies the above illuminance criterion, and the luminance of the organic EL illumination panel when this illuminance criterion is satisfied is determined as luminance of an organic EL illumination panel 10f to be adopted.

[Equation 1]

$$E_h = \frac{L}{2}\left\{\frac{x}{\sqrt{x^2+h^2}}\tan^{-1}\frac{y}{\sqrt{x^2+h^2}} + \frac{y}{\sqrt{y^2+h^2}}\tan^{-1}\frac{x}{\sqrt{y^2+h^2}}\right\} \quad (3)$$

Figure 17:
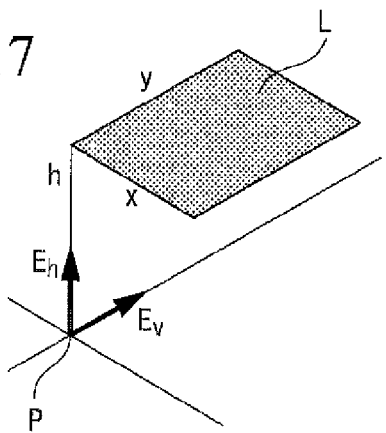
FIG. 17 is an illustrative diagram illustrating a coordinate system used when illuminance in a specific position in which light from a surface light source is received is obtained.
Figure 18A:
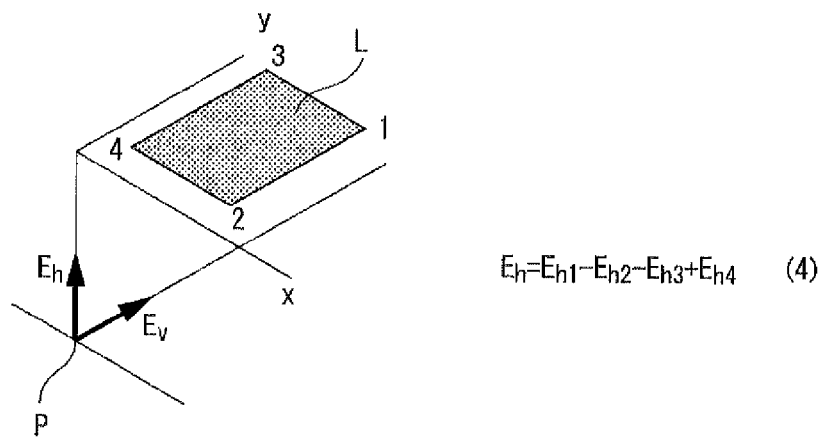
FIG. 18A is an illustrative diagram illustrating a method of obtaining illuminance in a specific position when there is no surface light source directly above the specific position.
Figure 18B:
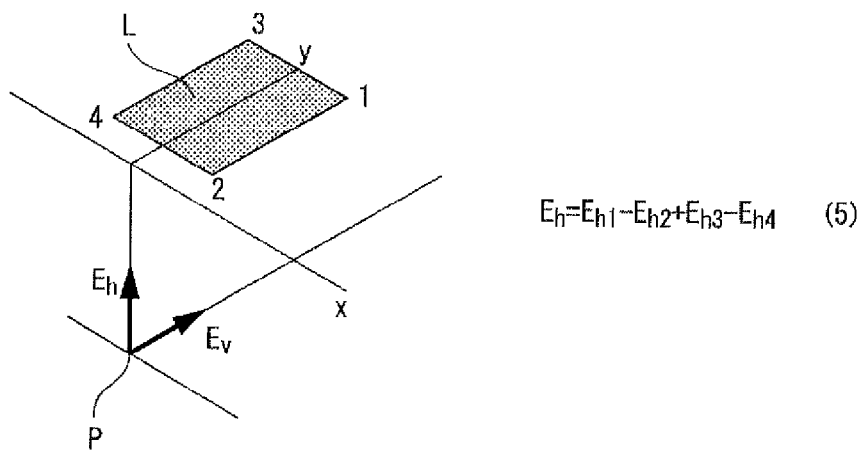
FIG. 18B is an illustrative diagram illustrating a method of obtaining illuminance in a specific position when there is no surface light source directly above the specific position.

Here, in Equation (3), $E_h$: horizontal illuminance (lx), and L: luminance (cd/m$^2$) of a surface light source. Further, in Equation (3), a specific position of the table surface and the extended surface is an origin p, a coordinate axis in the right and left direction of the fuselage is x, a coordinate axis in the longitudinal direction of the fuselage is y, and a coordinate axis in an up and down direction of the fuselage is h, as illustrated in FIG. 17. Further, in Equation (3), an angle of the rectangular surface light source L is assumed to be at x=0, y=0, and h=h. In other words, in Equation (3), the one angle of the rectangular surface light source L is assumed to be directly above a position in which the illuminance is to be obtained.

However, as illustrated in FIG. 19, in this embodiment, in the positions a to f that are positions on the table surface and the extended surface and in which illuminance is to be obtained, there is no angle of the surface light source directly above the positions. Therefore, illuminance $E_h$ of each of the positions c to f on the table surface is obtained using Equation (4) below, and illuminance $E_h$ of each of the positions a and b on the table surface and the extended surface is obtained using Equation (5) below.

$$E_h = E_{h1} - E_{h2} - E_{h3} + E_{h4} \quad (4)$$

$$E_h = E_{h1} - E_{h2} + E_{h3} - E_{h4} \quad (5)$$

Here, Equation (4) is an equation when there is no surface light source L in x and y directions of the position p in which the illuminance is to be obtained, as in the positions c to f of FIG. 19. That is, Equation (4) is an equation in the state illustrated in FIG. 18A. Further, Equation (5) is an equation when there is no surface light source L in the x direction of the position p in which the illuminance is to be obtained, as in positions a and b of FIG. 19, but there is a surface light source L in the y direction. That is, Equation (5) is an equation in the state illustrated in FIG. 18B. Further, $E_{h1}$ indicates illuminance of an origin p when there is one angle of the virtual surface light source directly above a position (origin) p in which illuminance is to be obtained, and there is, in a position 1, an angle of the virtual surface light source located in a diagonal angle of such an angle, and $E_{h2}$ indicates illuminance of the origin p when there is one angle of the virtual surface light source directly above the origin p, and there is, in a position 2, an angle of the virtual surface light source located in a diagonal angle of such an angle. Hereinafter, the same applies to $E_{h3}$ and $E_{h4}$. Further, the values of $E_{h1}$, $E_{h2}$, $E_{h3}$, and $E_{h4}$ are all obtained using Equation (3).

When the organic EL illumination panel 10f having the external size of 10×30 cm$^2$ and the luminance of 2000 cd/m$^2$ or more described above is used, the above illuminance criterion is substantially satisfied in each of the positions a to d, as illustrated in FIG. 19. However, the illuminance in the positions e and f outside the table on the extended surface of the table surface exceeds the maximum illuminance criterion defined in ARP 378. That is, when the organic EL illumination panel 10f is used, side leakage of the light increases.

Therefore, in this embodiment, the light shielding plate 32 is provided at both of right and left ends of the organic EL illumination panel 10f, so that side leakage of the light from the organic EL illumination panel 10f can be suppressed. Specifically, when an angle α of the light shielding plate 32 with respect to the organic EL illumination panel 10f is 45°, illuminance in the position f outside the table on the extended surface of the table surface is 16 lx, which satisfies the maximum illuminance criterion defined in ARP 378 for this position f.

If the initial luminance of the organic EL illumination panel 10f is 2000 cd/m$^2$, the lifespan of the organic EL illumination panel 10f is about 18000 hours when the organic EL illumination panel 10f is a neutral white type, and about 9000 hours when the organic EL illumination panel 10f is a bulb color type. Thus, such an organic EL illumination panel 10f is an alternative to a fluorescent lamp having a lifespan of about 10000 hours.

As described above, in this embodiment, since the organic EL illumination panel 10f having a thickness of 5 mm or less is installed on the back surface 83a of the backrest portion 83 of the front seat, it is possible to illuminate a hand space of a passenger sitting on the seat 81 without substantially reducing this hand space. Further, in this embodiment, since the organic EL illumination panel 10f is installed in a position close to the hand space of the passenger, it is possible to minimize diffusion of the light to the passenger sitting on the adjacent seat 81. Further, in this embodiment, since the light shielding plate 32 is provided in the organic EL illumination panel 10f, it is possible to reliably prevent the light from leaking to the passenger sitting on the adjacent seat 81.

Seventh Embodiment

Figure 20:
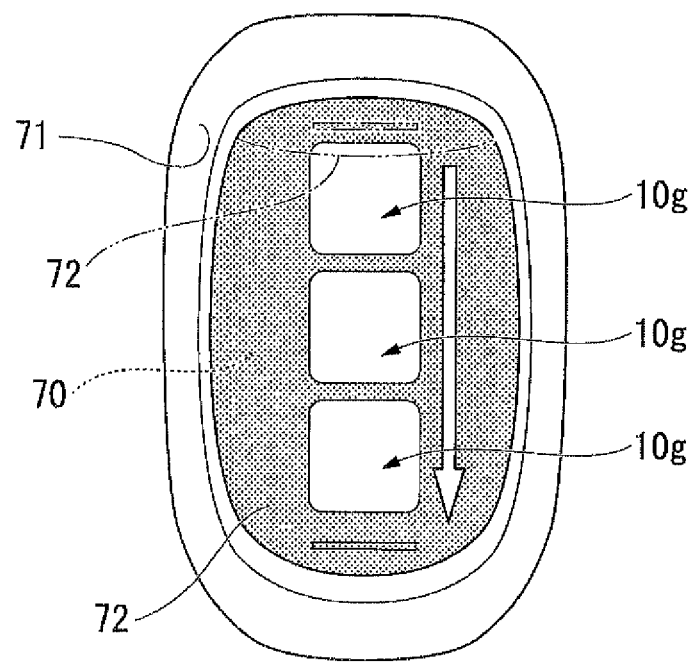
FIG. 20 is a front view of a window portion in a seventh embodiment of the present invention.

Next, an illumination device according to a seventh embodiment of the present invention will be described using FIG. 20.

The illumination device of this embodiment includes an organic EL illumination panel, and a panel driving circuit that drives this organic EL illumination panel according to an instruction from a control device, similarly to each of the above-described embodiments. Even in this embodiment, the organic EL illumination panel and the panel driving circuit have the same structure as the structure shown in the first embodiment or its modification example.

In this embodiment, an organic EL illumination panel 10g is installed on the inner side of a shade 72 provided along a window 70 on the internal side of the window 70 so that the transparent substrate 18 is directed to the inside of the aircraft.

Incidentally, in the above-described AIR 512, illuminance in a seat space is defined as 53.82 lx or more at the time of boarding and 21.53 lx or more during a night flight.

In this embodiment, in order to satisfy the illuminance criterion in a space 30 cm directly beside the shade 72, for example, the organic EL illumination panel 10g having a luminance of 300 cd/m$^2$ or more and an external size of 15×15 cm$^2$ was assumed to be installed in the shade 72. The luminance and the external size of the organic EL illumination panel 10g illustrated here were obtained using Equations (1) and (2) above. Further, when initial luminance is 300 cd/m$^2$, a lifespan of the organic EL illumination panel 10g is about 300000 hours or more regardless of color temperature.

Generally, when direct sunlight is too bright, the passenger lowers the shade 72. However, in this case, the inside of the aircraft often becomes too dark. Further, when the shade 72 is lowered, view from the window 70 is blocked and thus the passenger feels somewhat stifled or cramped. In this embodiment, since the organic EL illumination panel 10g having a thickness is 5 mm or less and emitting light that is not too bright is installed on the inner side of the shade 72, it is possible to prevent the inside of the aircraft from being too dark without substantially reducing the inner space of the window 70 even if the shade 72 is lowered when sunlight enters the aircraft. Further, since the organic EL illumination panel 10g has a sense of depth when emitting the light unlike a fluorescent lamp, it is possible to prevent passengers from feeling stifled or cramped when the shade 72 is lowered.

Further, it is preferable for the vicinity of the passenger to be dark when the passenger lowers the shade 72 to sleep, and thus for a switch turning the organic EL illumination panel 10g ON or OFF to be separately provided. In this case, it is preferable for the switch to be provided in the inner window frame member 71 covering the vicinity of the window 70, the armrest portion 85 of the seat 81 or the like.

Modification Example of Seventh Embodiment

Figure 21:
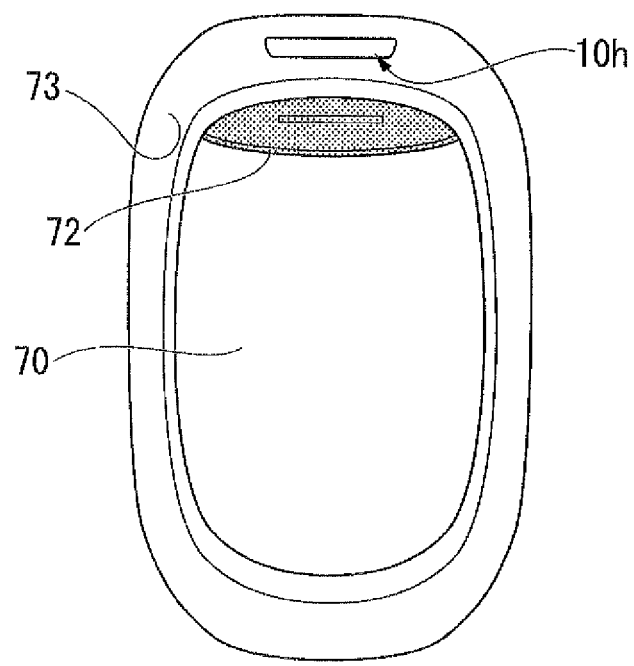
FIG. 21 is a view of a window portion in a modification example in the seventh embodiment of the present invention.

Next, a modification example of the seventh embodiment described above will be described using FIG. 21.

In the illumination device of this modification example, an organic EL illumination panel 10h is installed in an upper portion of an inner window frame member 71 covering the vicinity of the window 70 so that a transparent substrate 18 is directed to the inside of the aircraft.

In this modification example, the organic EL illumination panel 10h is installed in the upper portion of the inner window frame member 71. Accordingly, even if the shade 72 is lowered when sunlight enters the aircraft, it is possible to prevent the inside of the aircraft from being too dark without substantially reducing the inner space of the window 70, similarly to the seventh embodiment.

Eighth Embodiment

Next, an illumination device according to an eighth embodiment of the present invention will be described using FIGS. 22 to 24.

The illumination device of this embodiment includes an organic EL illumination panel, and a panel driving circuit that drives this organic EL illumination panel according to an instruction from a control device, similarly to each of the above-described embodiments. Even in this embodiment, the organic EL illumination panel and the panel driving circuit have the same structure as the structure shown in the first embodiment or its modification example.

Figure 22:
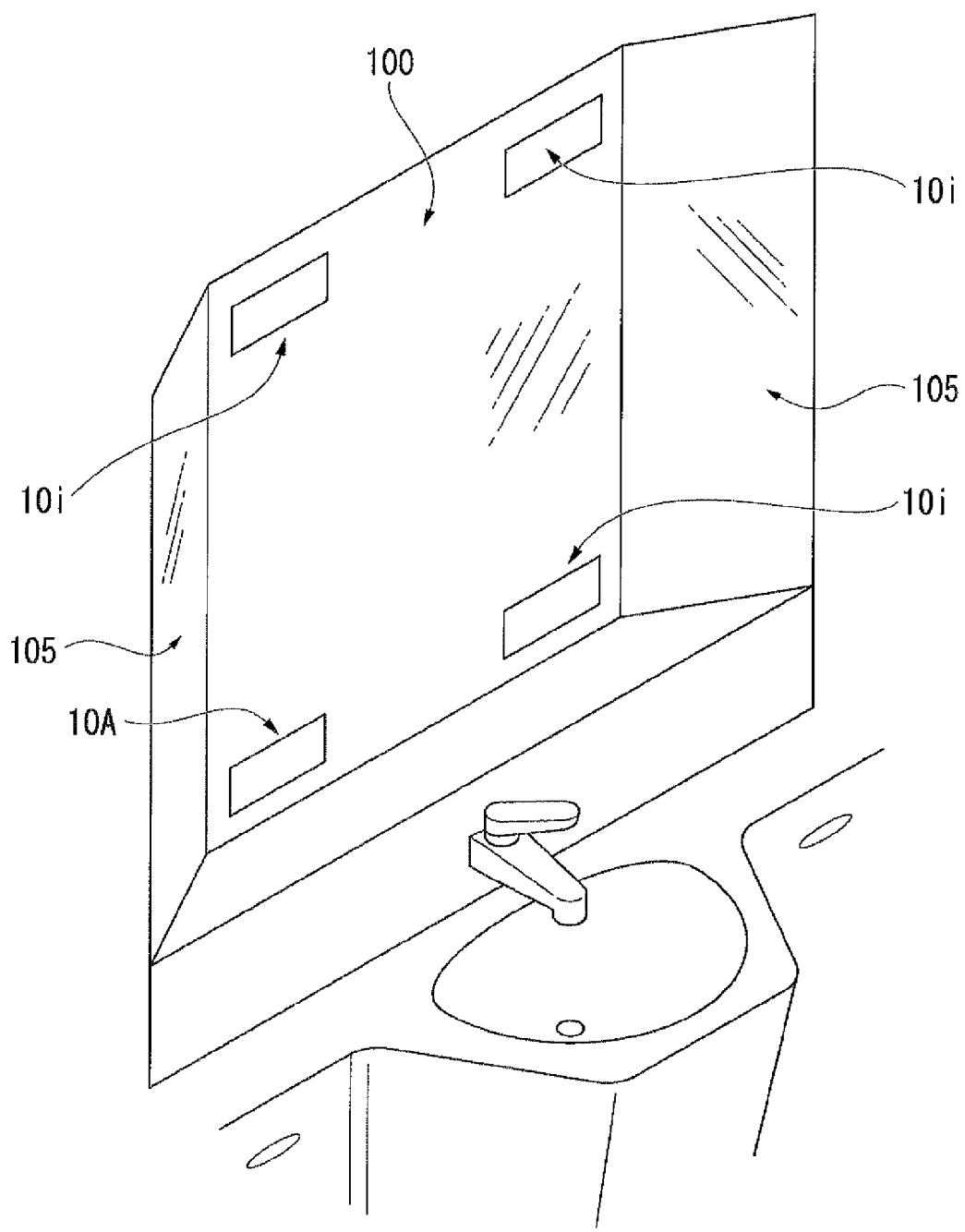
FIG. 22 is a perspective view of a mirror in a lavatory in an eighth embodiment of the present invention.

In this embodiment, an organic EL illumination panel 10i is installed in a mirror 100 of a lavatory so that a transparent substrate 18 is directed in a direction in which the mirror 100 reflects light, that is, the interior of the lavatory, as illustrated in FIG. 22. This organic EL illumination panel 10i is installed in respective positions on right and left sides of an upper portion and respective positions on right and left sides of a lower portion of the mirror 100. The organic EL illumination panels 10i installed in the upper portion of the mirror 100 mainly serve to illuminate a face of a passenger and a vicinity thereof. On the other hand, the organic EL illumination panels 10i installed in the lower portion of the mirror 100 mainly serve to illuminate hands of the passenger, a faucet, and the vicinity thereof.

Figure 23:
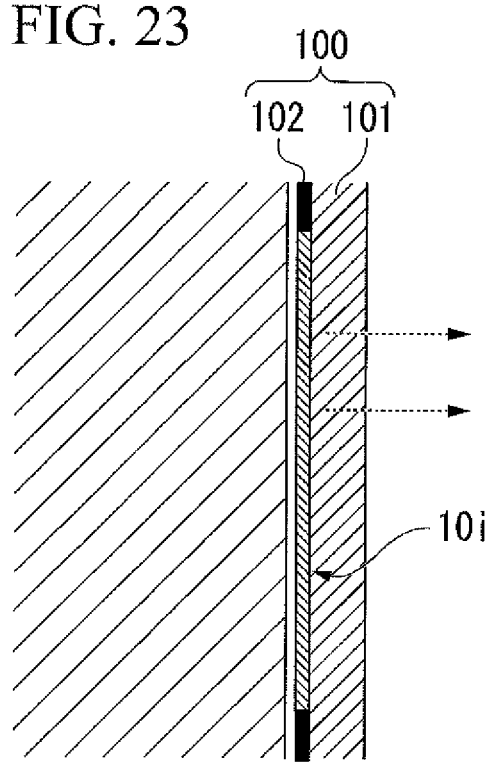
FIG. 23 is a cross-sectional view of a mirror and an organic EL illumination panel in the eighth embodiment of the present invention.
Figure 24:
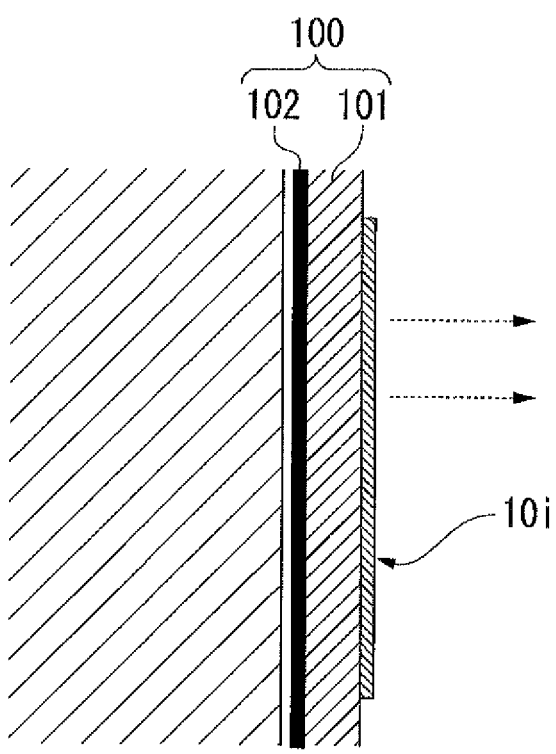
FIG. 24 is a cross-sectional view of another mirror and an organic EL illumination panel in the eighth embodiment of the present invention.

The mirror 100 is generally formed of a transparent plate 101 such as a transparent glass plate, and a reflection layer 102 applied to one surface of this transparent plate 101, as illustrated in FIGS. 23 and 24. The organic EL illumination panel 10i may be installed on the side of the transparent plate 101 in which the reflection layer 102 is formed as illustrated in FIG. 23 or may be installed on the side of the transparent plate 101 in which reflection layer 102 is not formed as illustrated in FIG. 24. However, when the organic EL illumination panel 10i is installed on the side of the transparent plate 101 in which the reflection layer 102 is formed, it is necessary to prevent the reflection layer 102 from coming between the transparent plate 101 and the organic EL illumination panel 10i. Further, regardless of whether the organic EL illumination panel 10i is installed on the reflection layer 102 side of the transparent plate 101 or the opposite side thereof, a recessed portion may be formed on the installation side of the transparent plate 101 and the organic EL illumination panel 10i may be buried in the recessed portion, or the organic EL illumination panel 10i may simply be pasted to the installation side of the transparent plate 101.

Incidentally, in the above-described AIR 512, illuminance of a task space in the lavatory is defined as 215.28 to 322.92 lx.

In this embodiment, in order to satisfy the illuminance criterion in a space 50 cm under a panel installation position, for example, the organic EL illumination panel 10i having a luminance of 2000 cd/m$^2$ or more and an external size of 7.5×30 cm$^2$ was assumed to be installed in the mirror 100. The luminance and the external size of the organic EL illumination panel 10i illustrated here were obtained using Equations (1) and (2) above. Further, if an initial luminance of the organic EL illumination panel 10i is 2000 cd/m$^2$, a lifespan of the organic EL illumination panel 10i is about 18000 hours if the organic EL illumination panel 10i is a neutral white type, and about 9000 hours if the organic EL illumination panel 10i is a bulb color type, as described above. Thus, such an organic EL illumination panel 10i is an alternative to a fluorescent lamp having a lifespan of about 10000 hours on an illuminance basis.

As described above, in this embodiment, since the organic EL illumination panel 10i having a thickness of 5 mm or less is installed in the mirror 100 in the lavatory, it is possible to sufficiently illuminate the task space for hand-washing or the like in the lavatory without substantially reducing the task space.

Further, when three mirrors 100, 105, and 105 are installed in different directions in the lavatory as illustrated in FIG. 22, a depth of the illumination is spread and the inside of the lavatory can be displayed beautifully.

Further, in this embodiment, a sensor that detects the presence of the passenger in the lavatory may be provided, and a switch which causes the organic EL illumination panel 10i to be in an on state when the presence of the passenger in the lavatory is detected by this sensor may be provided.

Ninth Embodiment

Figure 25:
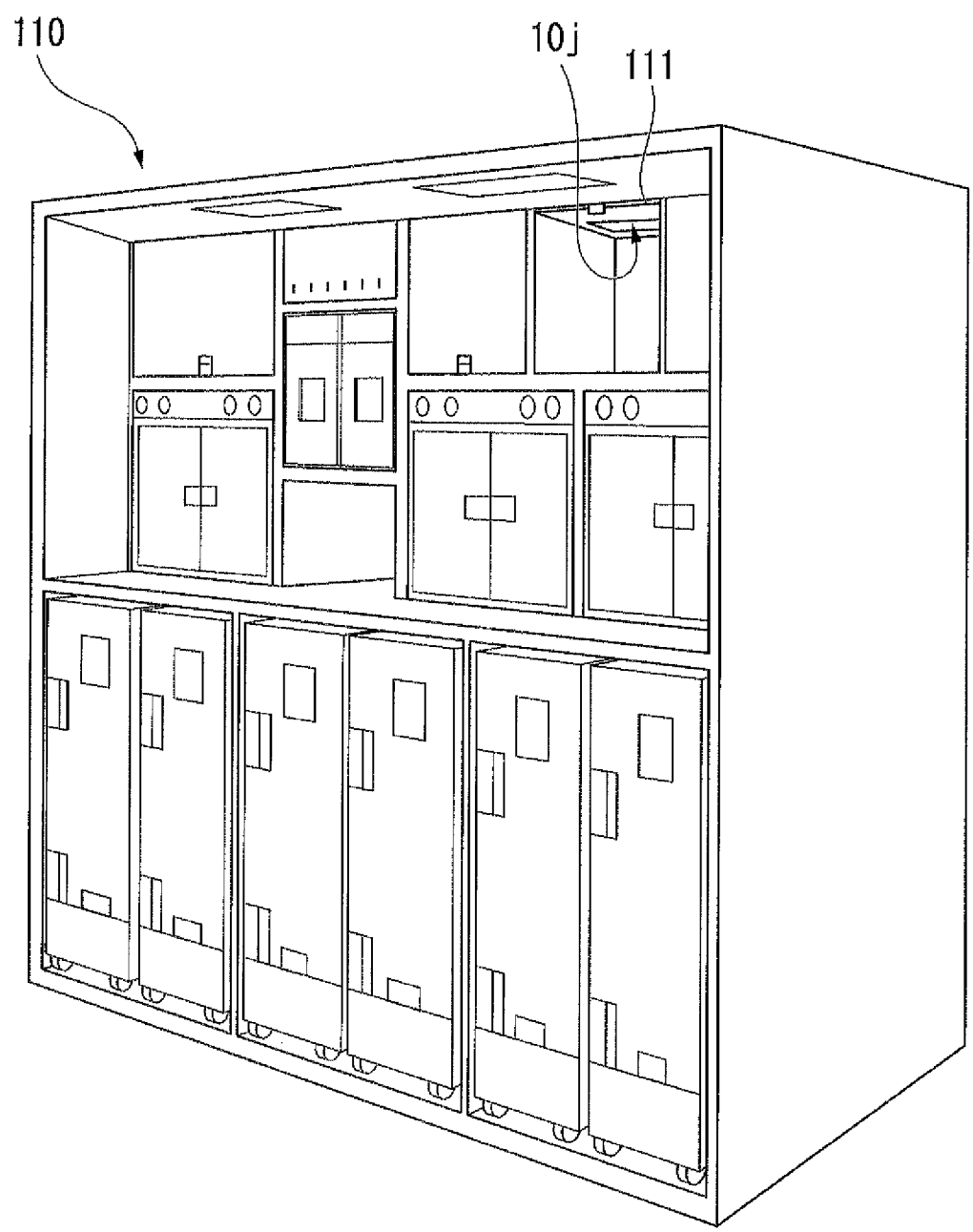
FIG. 25 is a perspective view of a closet in a galley in a ninth embodiment of the present invention.

Next, an illumination device according to a ninth embodiment of the present invention will be described using FIG. 25.

The illumination device of this embodiment includes an organic EL illumination panel, and a panel driving circuit that drives this organic EL illumination panel according to an instruction from a control device, similarly to each of the above-described embodiments. Even in this embodiment, the organic EL illumination panel and the panel driving circuit have the same structure as the structure shown in the first embodiment or its modification example.

In this embodiment, an organic EL illumination panel 10j is installed inside of a closet 110 of a galley so that the transparent substrate 18 is directed to the inside.

Incidentally, in the above-described AIR 512, the illuminance in the baggage rack is defined as 53.82 lx or more, but illuminance in the closet 110 of the galley is not separately defined. However, it is preferable for the same illuminance as the illuminance in the baggage rack to be secured in an internal space of the closet 110 of the galley.

As described above, in this embodiment, in order to satisfy the illuminance criterion in a space of 30 cm from the organic EL illumination panel 10j, for example, the organic EL illumination panel 10j having a luminance of 300 cd/m$^2$ or more and an external size of 7.5×30 cm$^2$ was assumed to be installed inside of the closet 110. The luminance and the external size of the organic EL illumination panel 10j illustrated here were obtained using Equations (1) and (2) above. Further, when an initial luminance is 300 cd/m$^2$, a lifespan of the organic EL illumination panel 10j is about 300000 hours regardless of color temperature, as described above.

As described above, in this embodiment, since the organic EL illumination panel 10j having a thickness of 5 mm or less is installed inside of the closet 110 of the galley, it is possible to illuminate the inside of the closet 110 without substantially reducing the internal space of the closet 110. Therefore, in this embodiment, it is possible to improve visibility in the closet 110 and increase work efficiency of the crew in the galley.

Further, in this embodiment, the organic EL illumination panel 10j may be turned on according to opening and closing of the door 111 of the closet 110. In this case, it is preferable that opening and closing of the door 111 be detected by a switch, and the organic EL illumination panel 10 be turned on when the door 111 is opened and turned off when the door 111 is closed.

Tenth and Eleventh Embodiments

Figure 26:
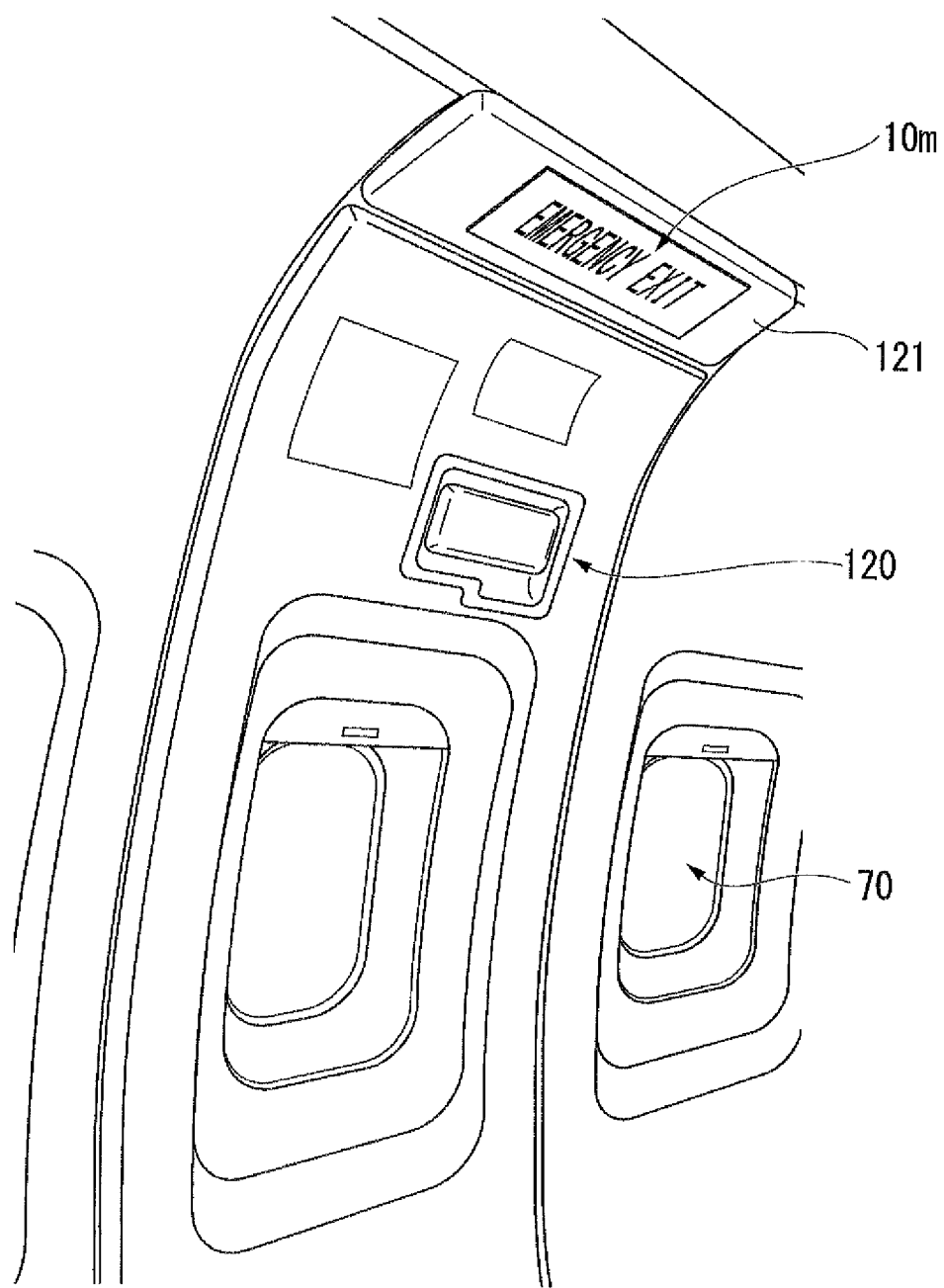
FIG. 26 is a perspective view of the vicinity of an emergency exit in a tenth embodiment of the present invention.
Figure 27:
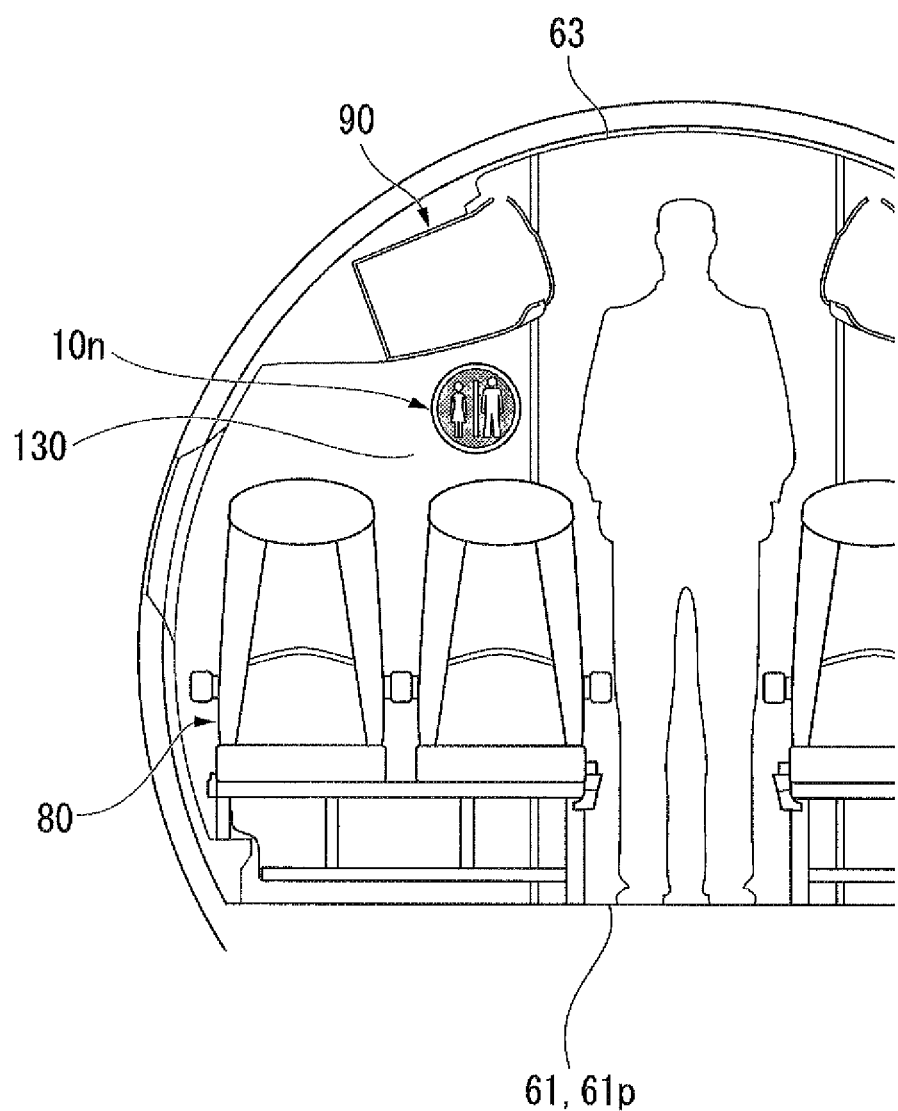
FIG. 27 is an essential portion cross-sectional view of the body in an eleventh embodiment of the present invention.

Next, an illumination device according to tenth and eleventh embodiments of the present invention will be described using FIGS. 26 to 28.

The illumination device of the tenth and eleventh embodiments includes an organic EL illumination panel 10, and a panel driving circuit 30 that drives this organic EL illumination panel 10 according to an instruction from the control device 35, similarly to each of the above-described embodiments.

The organic EL illumination panels 10m and 10n of the tenth and eleventh embodiments play a role of a sign light. Specifically, the organic EL illumination panel 10m of the tenth embodiment is installed on the aircraft inside of a wall member 121 surrounding around an emergency exit 120 so that the transparent substrate 18 is directed to the inside of the aircraft, as illustrated in FIG. 26, and serves as a sign light indicating a position of the emergency exit 120. This organic EL illumination panel 10m is a rectangular shape on which the words "Emergency exit EXIT" are written. Further, the organic EL illumination panel 10n of the eleventh embodiment is installed on a partition wall member 130 toward the inside of the cabin so that the transparent substrate 18 is directed toward the inside of the cabin, as illustrated in FIG. 27, and serves as a sign light indicating whether a lavatory is in use. This organic EL illumination panel 10n is a circular shape with a picture of a person.

Thus, it is preferable that the organic EL illumination panels 10m and 10n serving as the sign light have text and a figure indicating content of which to inform passengers depending on the content and a shape depending on the content as the sign light.

In each of the organic EL illumination panels 10m and 10n of the tenth and eleventh embodiments, a sheet 25 with a figure or text indicating content of which to inform passengers is added to the organic EL illumination panel 10 (FIG. 4) of the first embodiment, as illustrated in FIG. 28. For example, this sheet 25 is a transparent resin sheet and is bonded to the transparent substrate 18.

Incidentally, in "Aerospace Recommended Practice 503" (hereinafter, ARP 503) from SAE Aerospace mentioned above, illuminance of a sign light in the vicinity of an emergency exit is defined as 86 lx or more and illuminance of the sign light on a partition between cabins is defined as 1.3 lx or more. Therefore, in the organic EL illumination panels 10m and 10n serving as the sign light, an initial luminance of about 100 cd/m² is enough. Further, when the initial luminance is 300 cd/m², a lifespan of the organic EL illumination panels 10m and 10n is 300000 hours or more regardless of color temperature, as described above.

As described above, in the tenth and eleventh embodiments, it is possible to cause the organic EL illumination panels 10m and 10n to function as the sign light even when an installation space is not substantially secured inside a wall or in a space partitioned by this wall. Further, the sign light is a surface light source, and uniform luminance is required in respective positions on the surface so as to avoid misrecognition of content of which to inform passengers. Since the organic EL illumination panels 10m and 10n of the tenth and eleventh embodiments satisfy these requirements, causing the organic EL illumination panels 10m and 10n to function as a sign light is very useful, as in the tenth and eleventh embodiments.

Further, since it is preferable for the sign light to be turned on even during an emergency when all power supply in the aircraft fails, a light storing layer may be added to the organic EL illumination panel, as in the fourth embodiment described using FIG. 12. Furthermore, the light storing layer may be similarly added to the organic EL illumination panels in the other embodiments.

INDUSTRIAL APPLICABILITY

According to this illumination device, it is possible to illuminate the internal space of the fuselage without substantially reducing the internal space of the fuselage.

REFERENCE SIGNS LIST 10, 10a, 10b, 10c, 10d, 10e, 10f, 10g, 10h, 10i, 10j, 10m, 10n Organic EL illumination panel
11 Light emitting unit
12 Light emitting layer
15 Charge generation layer
16 Stacked body
17a Positive electrode (electrode)
17b Negative electrode (electrode)
18 Transparent substrate
18b Sealing substrate
19 Heat radiation plate
23 Light storing layer
25 Sheet
30 Panel driving circuit
31 Panel connector
32 Light shielding plate
61 Floor member
61p Aisle
63 Ceiling member
70 Window
71 Inner window frame member
72 Shade
80 Seat device
81 Seat
82 Seat portion
83 Backrest portion
84 Table
90 Baggage rack
91 Rack body
92 Opening (of baggage rack)
93 Cover
100 Mirror
101 Transparent plate
102 Reflection layer
110 Closet
120 Emergency exit
121 Wall member (near emergency exit)
130 Partition wall member

The invention claimed is:

1. An illumination device for an inside of a fuselage of an aircraft, the illumination device comprising:
an organic EL illumination panel adapted to be installed in an aircraft member in the fuselage; and
a panel driving circuit that drives the organic EL illumination panel and is installed in a different place apart from the organic EL illumination panel in the fuselage to drive the organic EL illumination panel,
wherein the organic EL illumination panel includes
a plurality of light emitting units including at least a light emitting layer including an organic material;
a charge generation layer arranged between the plurality of light emitting units;
a pair of electrodes that include a positive electrode and a negative electrode, and that supply power from the panel driving circuit to a stacked body including the plurality of light emitting units and the charge generation layer;

a transparent substrate arranged on a side of the positive electrode, the side of the positive electrode being opposite to the negative electrode;

a sealing substrate arranged on a side of the negative electrode, the side of the negative electrode being opposite to the positive electrode; and a sealing member arranged on the outer periphery of the stacked body and the pair of electrodes, arranged between the transparent substrate and the sealing substrate, and bonding the transparent substrate and the sealing substrate, wherein a gap is secured between the sealing substrate and the negative electrode, the gap is filled with a filler selected from the group consisting of a moisture absorbent, an inert gas, and silicone oil, and the organic EL illumination panel has a thickness of 5 mm or less in a stacking direction.

2. A fuselage for an aircraft comprising:
an aircraft member arranged inside the fuselage; and
the illumination device according to claim 1,
wherein the illumination device is installed in the aircraft member.

3. The fuselage according to claim 2, wherein:
the aircraft member includes a seat and a baggage rack arranged above the seat, and,
the baggage rack has a curved surface; and
the organic EL illumination panel of the illumination device is installed on a floor side of the baggage rack along the curved surface so that the transparent substrate is directed to the floor side, and has a luminance of 1000 cd/m$^2$ or more.

4. The fuselage according to claim 2, wherein:
the aircraft member is a baggage rack that includes a rack body having an opening formed therein, and a cover closing the opening of the rack body;
an inner side in the cover of the baggage rack has a curved surface; and
the organic EL illumination panel of the illumination device is installed on the inner side in the cover of the baggage rack along the curved surface so that the transparent substrate is directed to the internal side, and has a luminance of 300 cd/m$^2$ or more.

5. The fuselage according to claim 2, wherein:
the aircraft member is a plurality of seats that is formed and arranged in a cascade in the fuselage, the plurality of seats having a backrest portion;
the illumination device further includes:
  a panel connector that attaches the organic EL illumination panel to the backrest portion to be capable of being opened and closed between a closed state in which the transparent substrate of the organic EL illumination panel faces a back surface of the backrest portion and an opened state in which the transparent substrate of the organic EL illumination panel forms an angle with respect to the back surface; and
  a light shielding plate attached at both ends of the organic EL illumination panel in a direction in which a virtual axis parallel to a floor surface extends to be opened and closed between a closed state in which the light shielding plate faces the transparent substrate and an opened state in which the light shielding plate forms an angle with respect to the transparent substrate;
  the panel connector swingably attaches the organic EL illumination panel to the backrest portion with respect to the virtual axis; and
  the organic EL illumination panel has a luminance of 2000 cd/m$^2$ or more.

6. The fuselage according to claim 5, wherein the illumination device further includes:
a switch that drives the organic EL illumination panel when the organic EL illumination panel is changed from the closed state to the opened state, and stops driving of the organic EL illumination panel when the organic EL illumination panel is changed from the opened state to the closed state.

7. The fuselage according to claim 5, wherein
the backrest portion has a curved surface, and
the organic EL illumination panel is provided along the curved surface of the backrest portion on the curved surface.

8. The fuselage according to claim 2, wherein:
the aircraft member is a shade that shades light from a window to an inside of the aircraft and that is arranged on an inner side of the window in the fuselage; and
at least one organic EL illumination panel of the illumination device is installed in the shade, and the organic EL illumination panel is installed on an inner side of the shade so that the transparent substrate is directed to the inside of the aircraft, and has a luminance of 300 cd/m$^2$ or more.

9. The fuselage according to claim 8, wherein
the shade or the inner window frame member has a curved surface, and
the organic EL illumination panel is provided along the curved surface of the shade or the inner window frame member on the curved surface.

10. The fuselage according to claim 2, wherein:
the aircraft member is an inner window frame member that covers a vicinity of a window in an inner side of the fuselage, and
the organic EL illumination panel of the illumination device is installed on an upper portion of the inner window frame member in the inner side of the fuselage so that the transparent substrate is directed to the inner side, and has a luminance of 300 cd/m$^2$ or more.

11. The fuselage according to claim 10, wherein
the shade or the inner window frame member has a curved surface, and
the organic EL illumination panel is provided along the curved surface of the shade or the inner window frame member on the curved surface.

12. The illumination device according to claim 1,
wherein the organic EL illumination panel includes a light storing layer including a light storing material.

13. The illumination device according to claim 12,
wherein the organic EL illumination panel includes a heat radiation plate arranged on the side of the negative electrode, the side of the negative electrode being opposite to the positive electrode,
the pair of electrodes are both transparent electrodes, and
the light storing layer is arranged between the negative electrode and the heat radiation plate.

14. An illumination device arranged in a fuselage of an aircraft, the illumination device comprising:
an organic EL illumination panel installed in an aircraft member in the fuselage; and
a panel driving circuit that drives the organic EL illumination panel and is installed in a different place apart from the organic EL illumination panel in the fuselage to drive the organic EL illumination panel,
wherein the organic EL illumination panel includes
a plurality of light emitting units including at least a light emitting layer including an organic material;
a charge generation layer arranged between the plurality of light emitting units;
a pair of electrodes that supply power from the panel driving circuit to a stacked body including the plurality of light emitting units and the charge generation layer; and
a transparent substrate arranged on the side opposite to first electrode of the pair of electrodes with respect to second electrode of the pair of electrodes, and
the organic EL illumination panel has a thickness of 5 mm or less in a stacking direction, wherein the organic EL illumination panel includes a light storing layer including a light storing material.

15. The illumination device according to claim 14,
wherein the organic EL illumination panel includes a heat radiation plate arranged on the side opposite to the second electrode with respect to the first electrode,
the pair of electrodes are both transparent electrodes, and
the light storing layer is arranged between the first electrode and the heat radiation plate.

\* \* \* \* \*